(12) United States Patent
Chang et al.

(10) Patent No.: US 12,484,251 B2
(45) Date of Patent: Nov. 25, 2025

(54) MULTIGATE DEVICE STRUCTURE WITH ENGINEERED GATE

(71) Applicant: Taiwan Semiconductor Manufacturing Company, Ltd., Hsin-Chu (TW)

(72) Inventors: Hsiao-Chun Chang, Hsinchu County (TW); Guan-Jie Shen, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 587 days.

(21) Appl. No.: 17/832,595

(22) Filed: Jun. 4, 2022

(65) Prior Publication Data

US 2023/0118779 A1   Apr. 20, 2023

Related U.S. Application Data

(60) Provisional application No. 63/255,478, filed on Oct. 14, 2021.

(51) Int. Cl.
*H10D 30/67* (2025.01)
*H10D 30/01* (2025.01)
*H10D 64/01* (2025.01)
*H10D 84/01* (2025.01)
*H10D 84/03* (2025.01)

(52) U.S. Cl.
CPC ....... *H10D 30/6735* (2025.01); *H10D 30/024* (2025.01); *H10D 30/031* (2025.01); *H10D 30/6713* (2025.01); *H10D 30/6757* (2025.01); *H10D 64/017* (2025.01); *H10D 64/018* (2025.01); *H10D 84/0128* (2025.01); *H10D 84/013* (2025.01); *H10D 84/0147* (2025.01);
(Continued)

(58) Field of Classification Search
CPC ........... H10D 30/6735; H10D 30/6757; H10D 84/013; H10D 64/018; H10D 64/017; H10D 84/0158; H10D 30/6713; H10D 84/0128; H10D 84/038; H10D 30/031; H10D 30/024; H10D 84/0147
See application file for complete search history.

(56) References Cited

U.S. PATENT DOCUMENTS 8,796,666 B1   8/2014   Huang et al.
8,815,712 B2   8/2014   Wan et al.
(Continued)

FOREIGN PATENT DOCUMENTS

KR   20170135115 A   12/2017
KR   20200139295 A   12/2020
(Continued)

*Primary Examiner* — Alonzo Chambliss
(74) *Attorney, Agent, or Firm* — HAYNES AND BOONE, LLP

(57) ABSTRACT

The present disclosure provides one embodiment of a semiconductor structure. The semiconductor structure includes a fin region formed on a substrate, wherein the fin region includes multiple channels vertically stacked on the substrate; a gate stack disposed on the fin region, wherein the gate stack is wrapping around each of the multiple channels and includes gate extensions being extending laterally to be overlapped with inner spacers; and a pair of source/drain (S/D) features formed on the fin region, interposed by the gate stack, and connected with the multiple channels.

20 Claims, 21 Drawing Sheets

(52) U.S. Cl.
CPC ....... *H10D 84/0158* (2025.01); *H10D 84/038* (2025.01)

(56) References Cited

U.S. PATENT DOCUMENTS

| | | | |
|---|---|---|---|
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,962,400 | B2 | 2/2015 | Tsai et al. |
| 8,963,258 | B2 | 2/2015 | Yu et al. |
| 9,093,514 | B2 | 7/2015 | Tsai et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,245,805 | B2 | 1/2016 | Yeh et al. |
| 9,520,482 | B1 | 12/2016 | Chang et al. |
| 9,548,303 | B2 | 1/2017 | Lee et al. |
| 9,576,814 | B2 | 2/2017 | Wu et al. |
| 10,903,124 | B2 * | 1/2021 | Lallement .......... H10D 84/0172 |
| 11,322,619 | B2 * | 5/2022 | Lin ..................... H10D 62/151 |
| 11,764,287 | B2 * | 9/2023 | Liaw .................. H10D 84/0179 257/288 |
| 11,996,468 | B2 * | 5/2024 | Lin .................... H01L 29/78696 |
| 12,237,419 | B2 * | 2/2025 | Huang ............... H10D 30/6211 |
| 2013/0285116 | A1 | 10/2013 | Lochtefeld et al. |
| 2014/0252412 | A1 | 9/2014 | Tsai et al. |
| 2017/0345945 | A1 | 11/2017 | Lee et al. |
| 2019/0081152 | A1 * | 3/2019 | Suh ...................... H10D 62/121 |
| 2019/0181140 | A1 | 6/2019 | Rodder et al. |
| 2019/0221483 | A1 | 7/2019 | Mulfinger |
| 2020/0044087 | A1 * | 2/2020 | Guha ................. H10D 30/6217 |
| 2020/0312844 | A1 * | 10/2020 | Jeon ................... H10D 30/6735 |
| 2021/0202756 | A1 | 7/2021 | Chang et al. |
| 2021/0280716 | A1 | 9/2021 | Peng et al. |
| 2021/0305401 | A1 | 9/2021 | Liaw |
| 2022/0367683 | A1 * | 11/2022 | Chen ...................... H10B 10/125 |
| 2022/0392998 | A1 * | 12/2022 | Lee ...................... H10D 62/121 |

FOREIGN PATENT DOCUMENTS

| | | |
|---|---|---|
| KR | 20210053167 A | 5/2021 |
| KR | 20210091478 A | 7/2021 |
| TW | 202127663 A | 7/2021 |

* cited by examiner

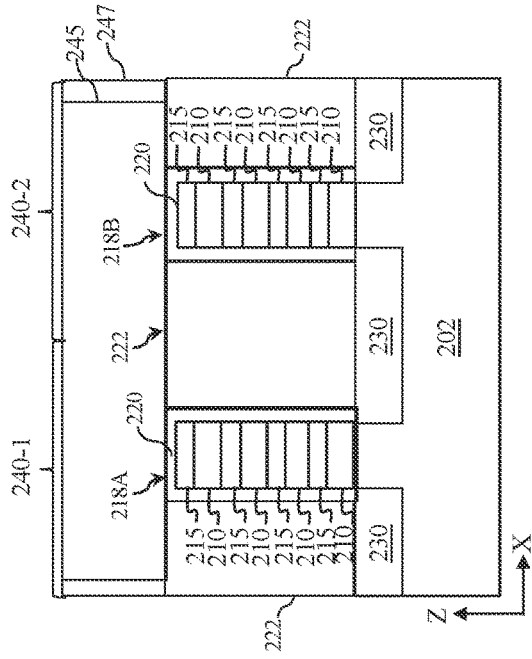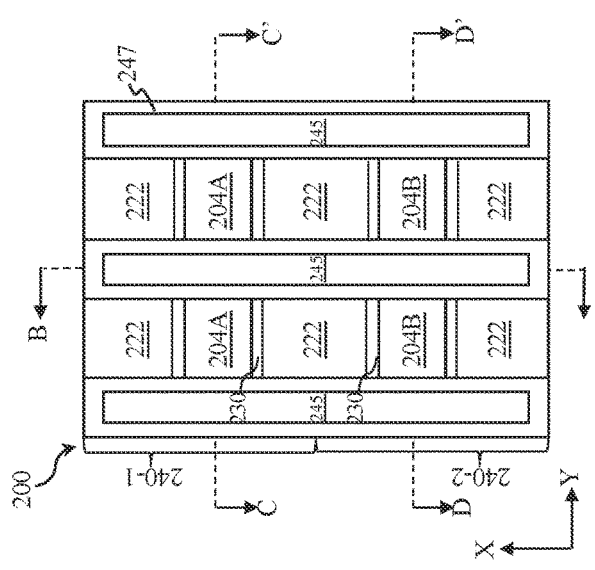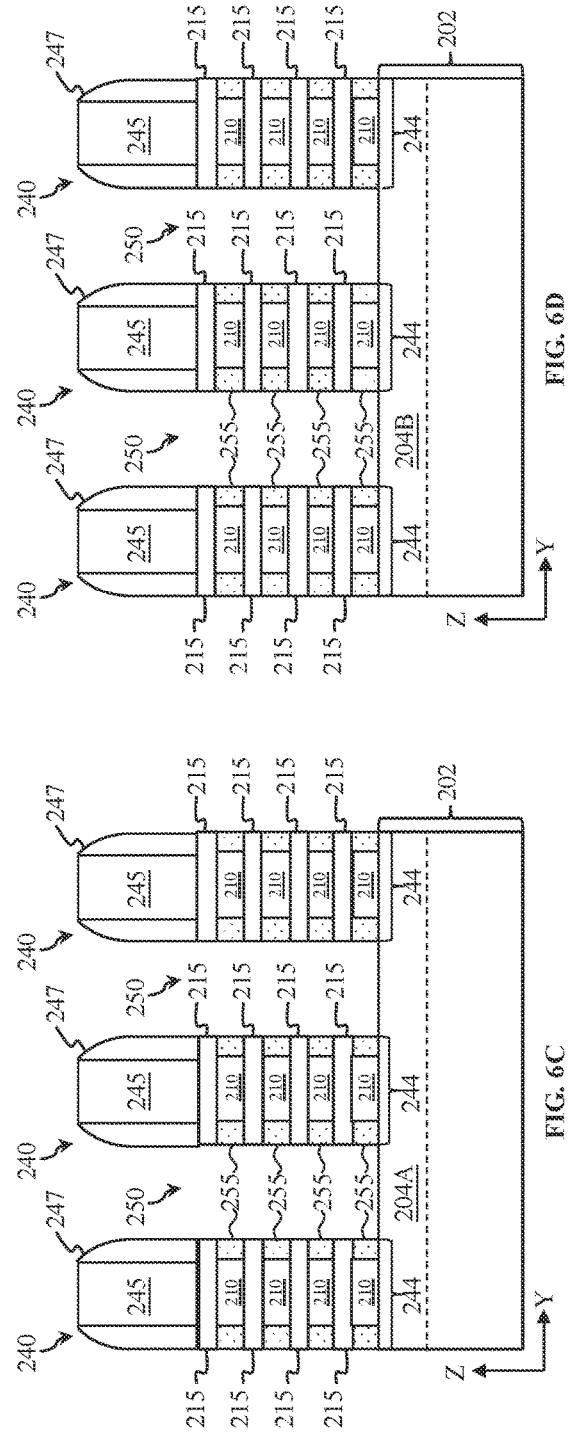

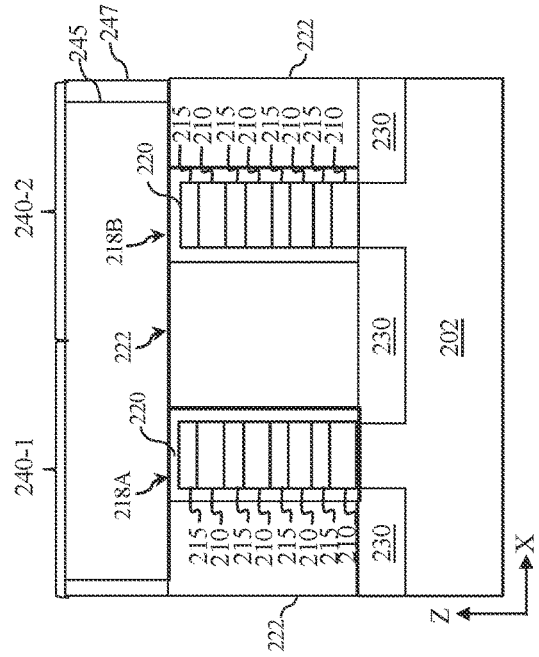
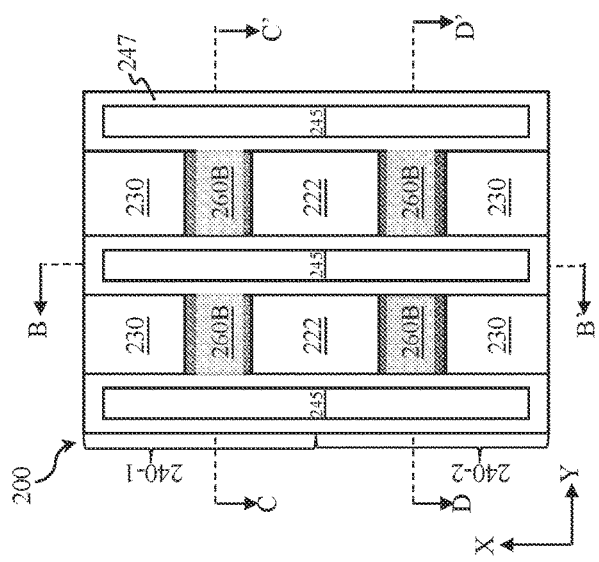
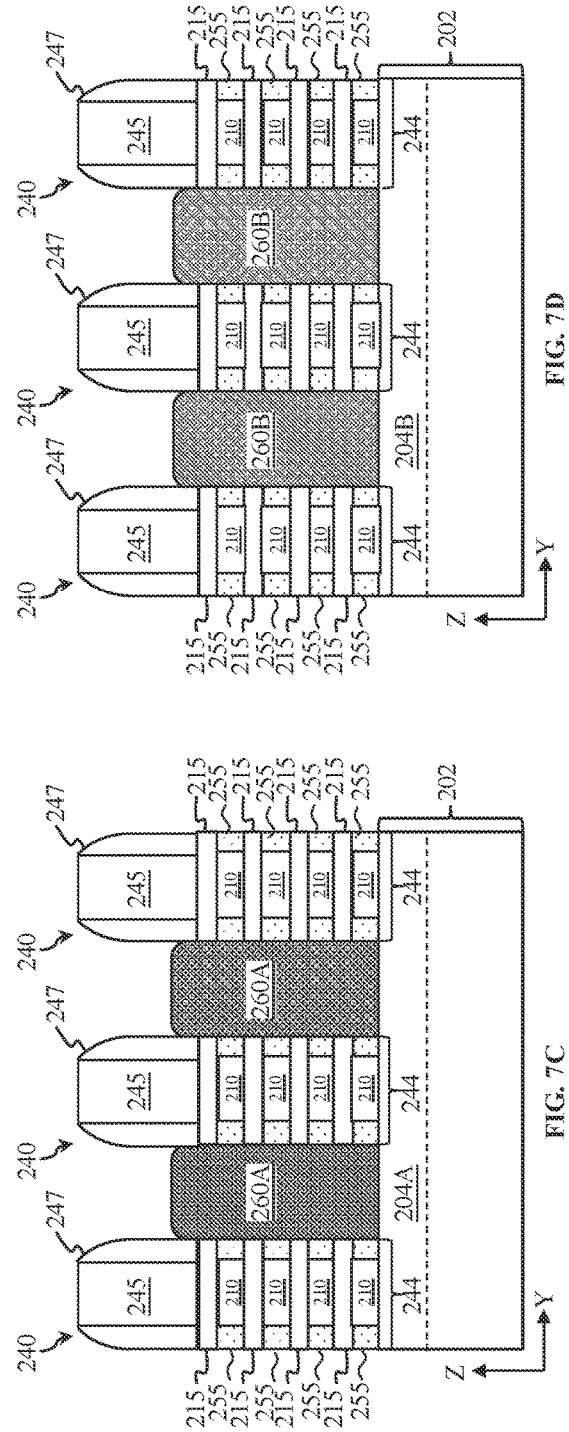
FIG. 7A
FIG. 7B
FIG. 7C
FIG. 7D

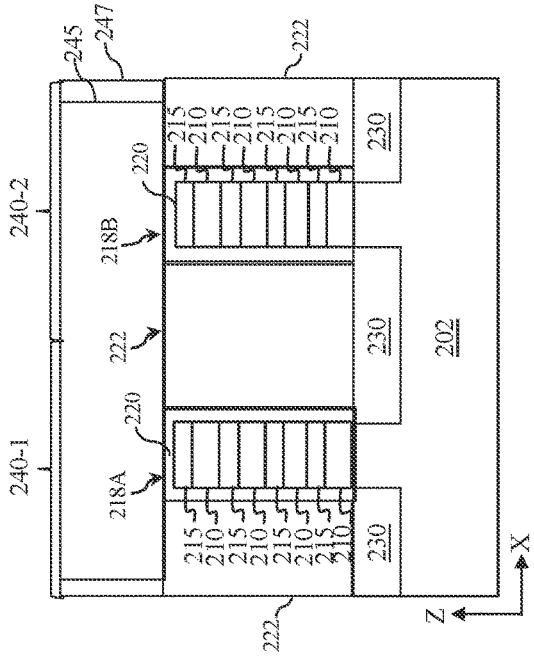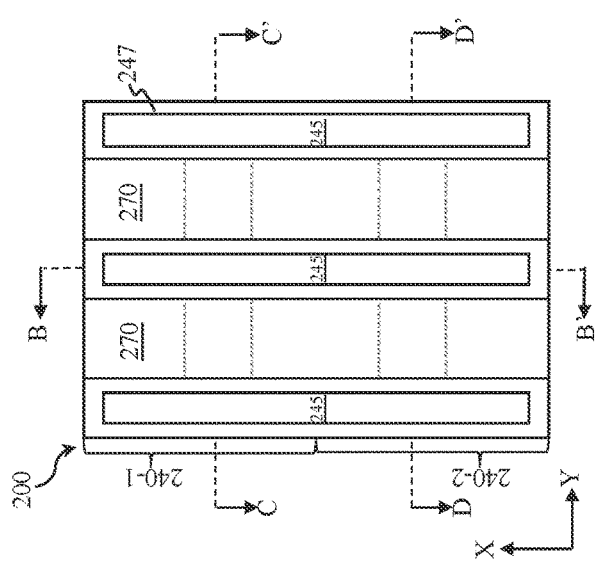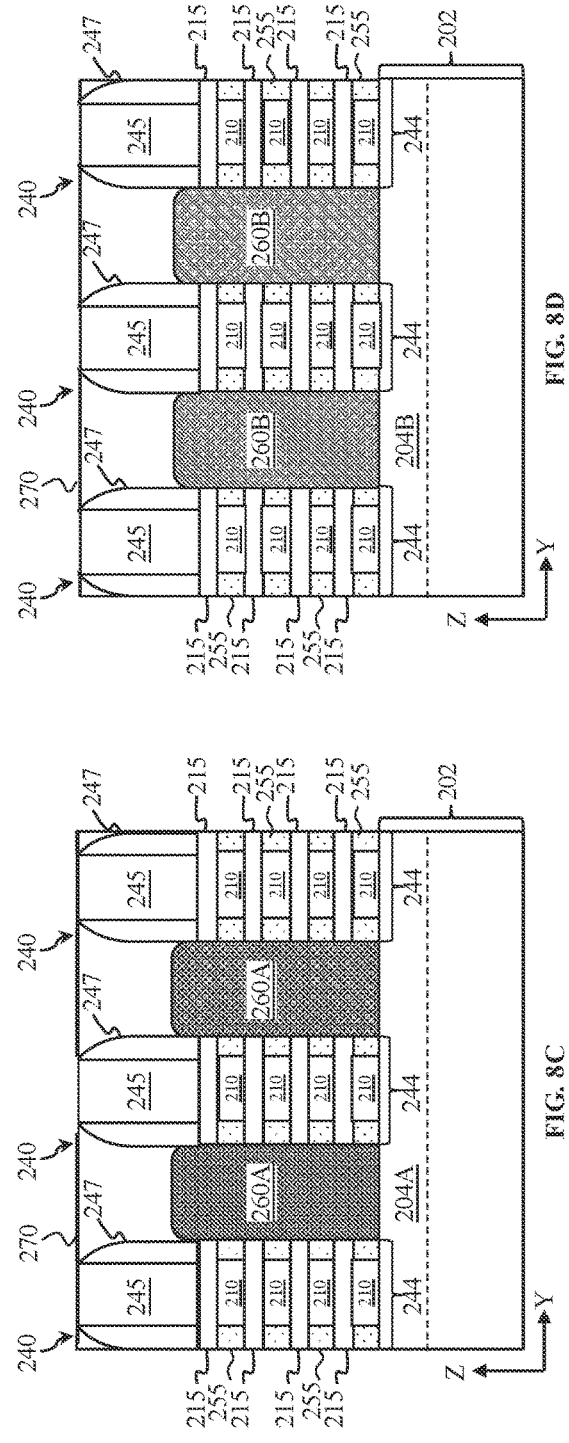
FIG. 8A
FIG. 8B
FIG. 8C
FIG. 8D

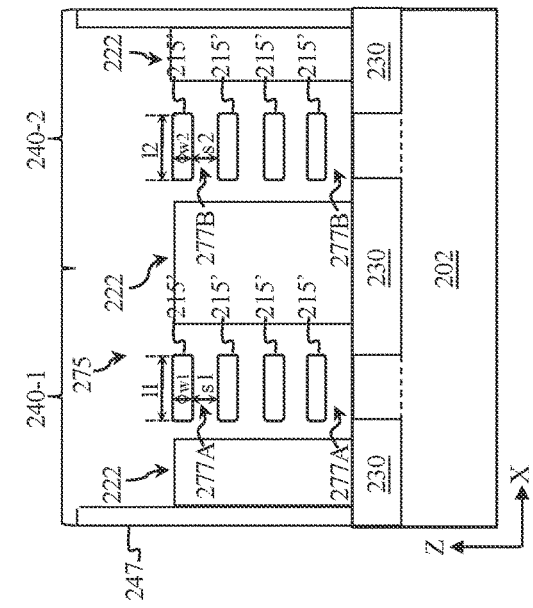
FIG. 10A
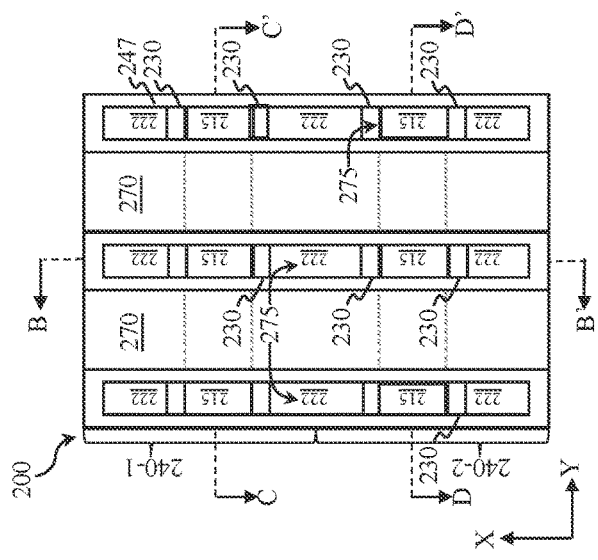
FIG. 10B
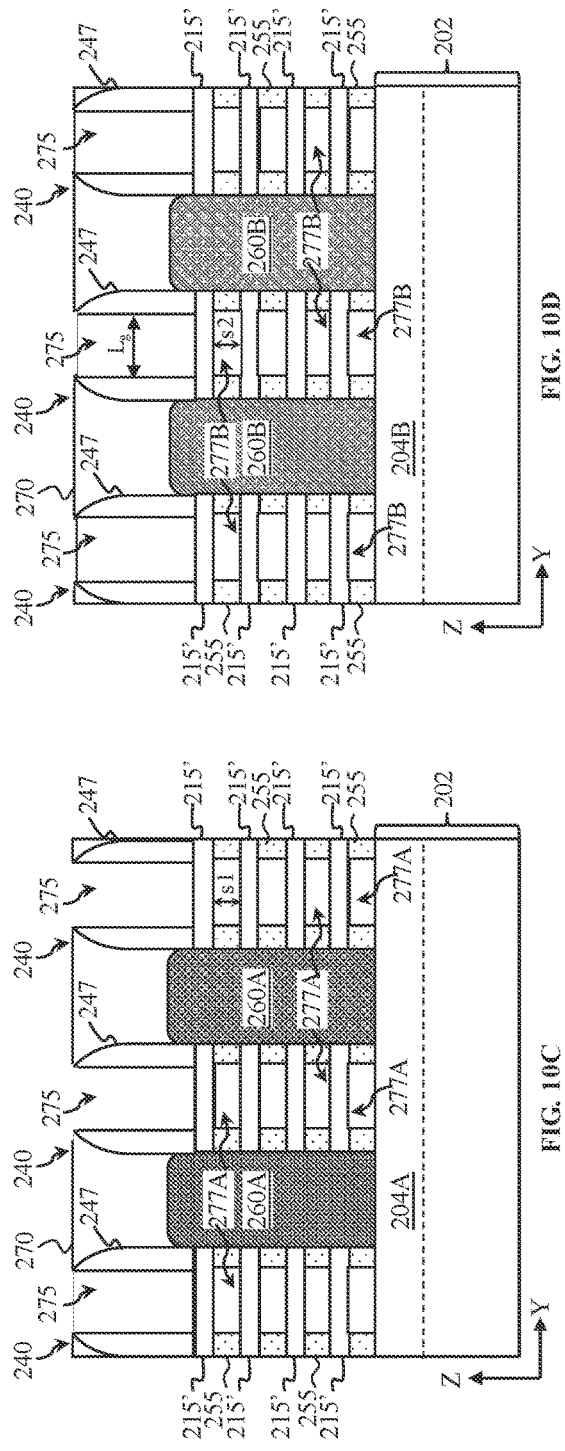
FIG. 10C
FIG. 10D

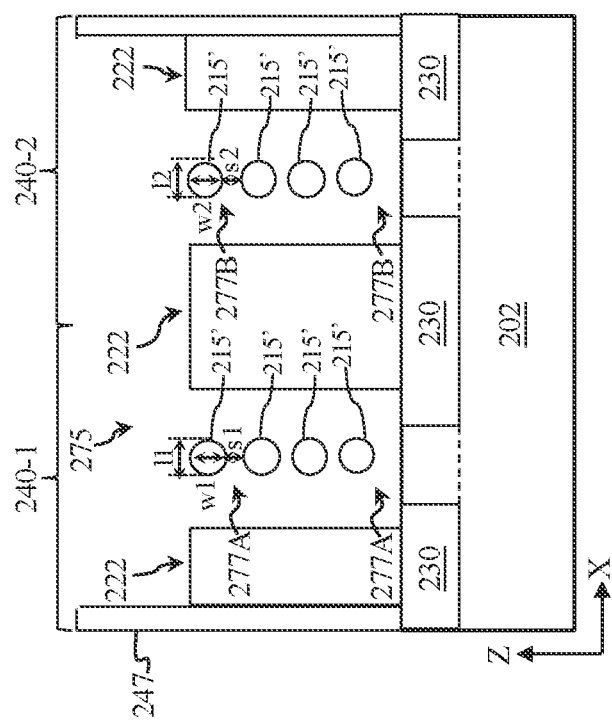

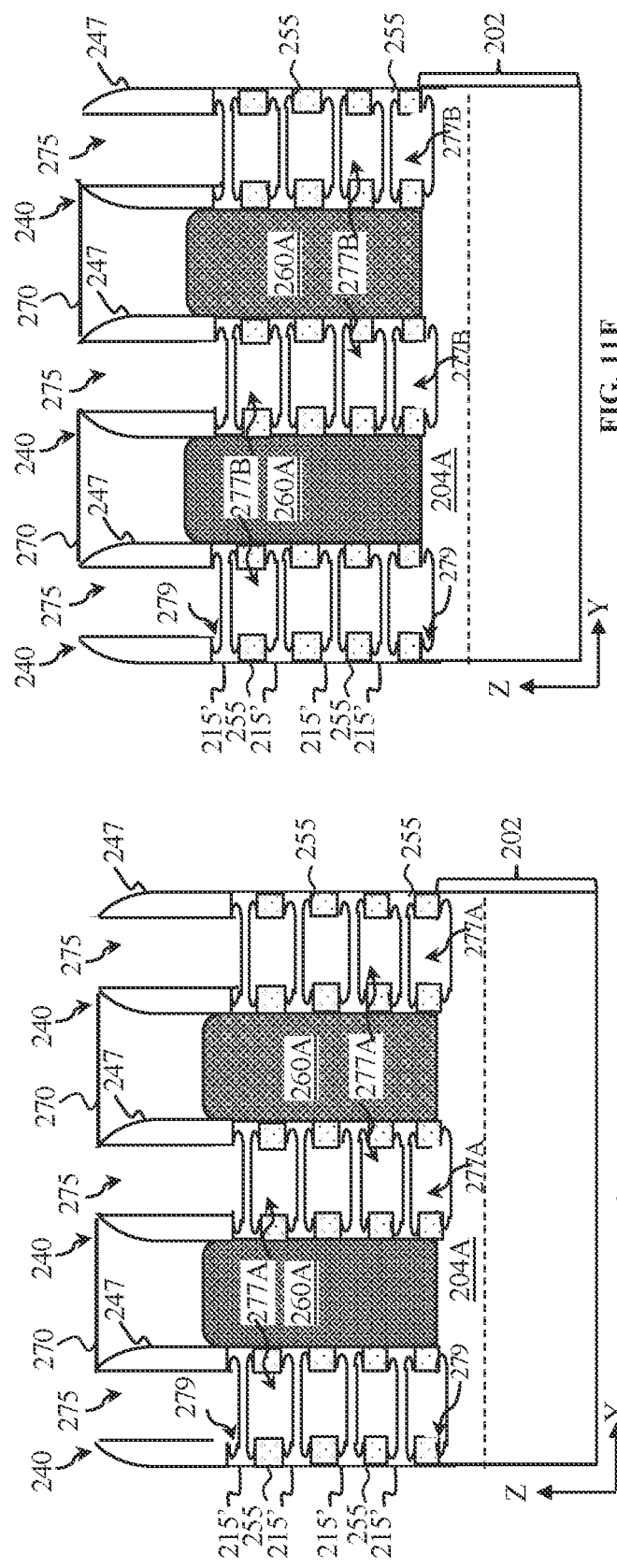

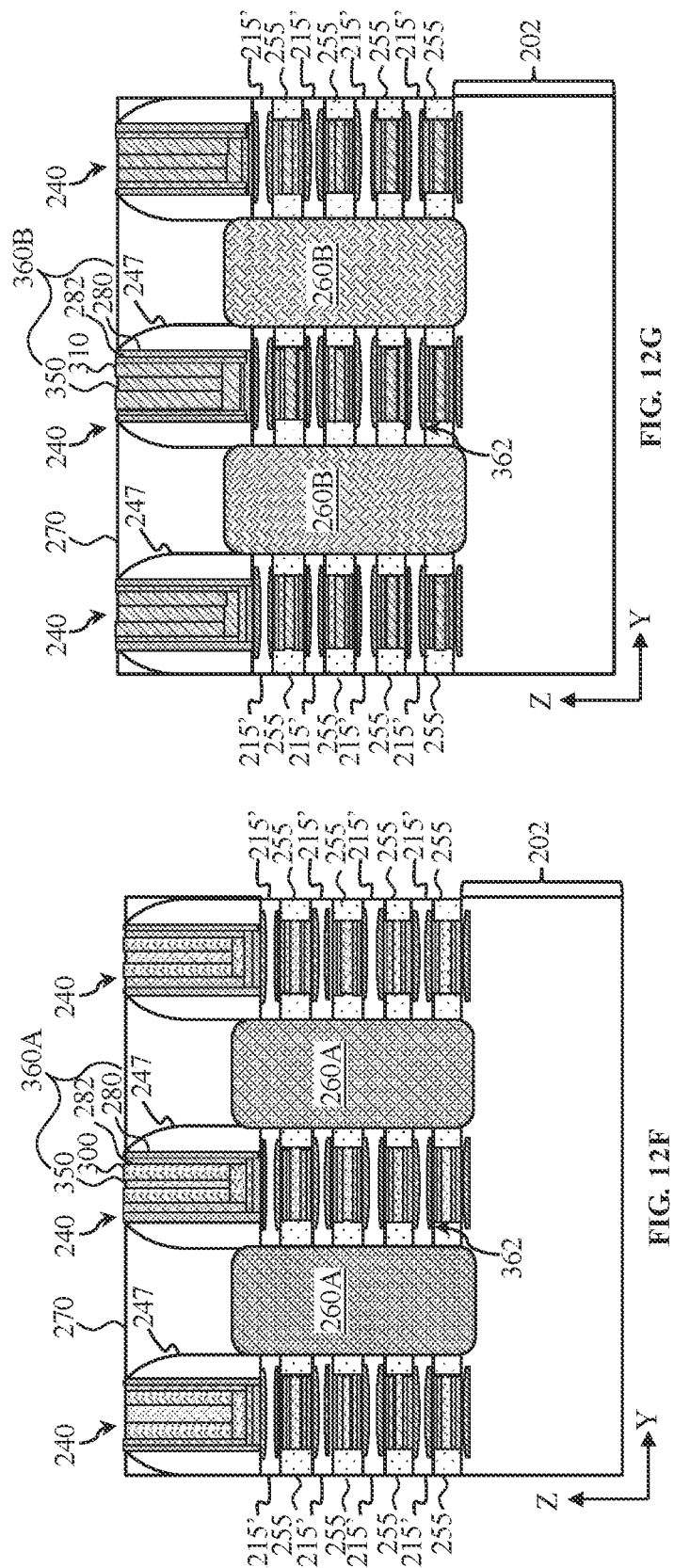

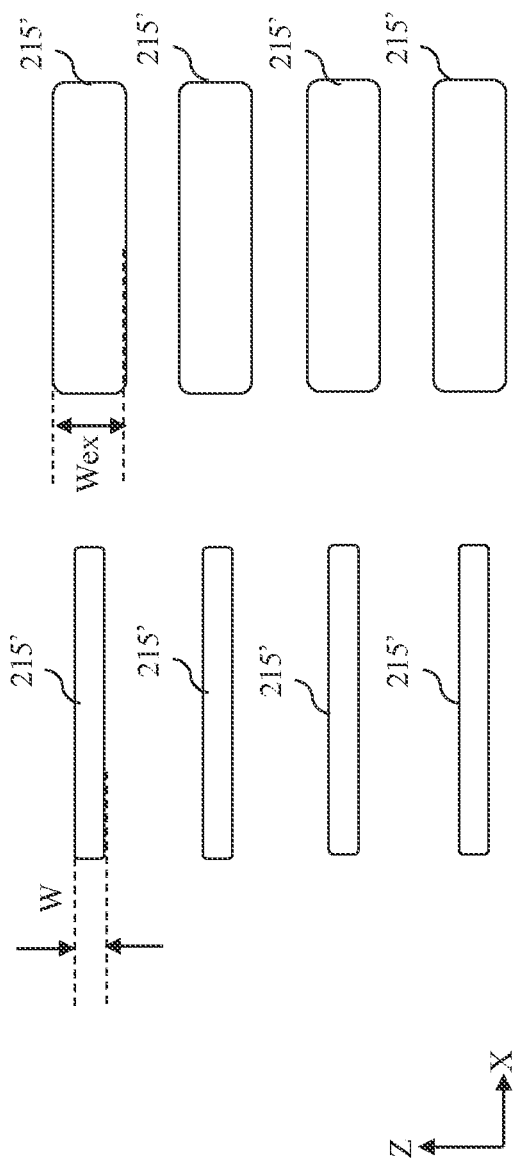

MULTIGATE DEVICE STRUCTURE WITH ENGINEERED GATE

This application claims priority to U.S. Provisional Patent Application Ser. No. 63/255,478 filed Oct. 14, 2021, the entire disclosure of which is hereby incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. As GAA devices continue to scale, challenges have arisen when fabricating a gate structure for a GAA device, which challenges have been observed to degrade GAA device performance and increase GAA processing complexity. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-12A, FIGS. 2B-12B, FIGS. 2C-12C, and FIGS. 2D-12D are fragmentary diagrammatic views of a multigate device, in portion or entirety, at various fabrication stages (such as those associated with the method in FIG. 1) according to various aspects of the present disclosure.

FIG. 10E is a fragmentary diagrammatic view of the multigate device, in portion or entirety according to various aspects of the present disclosure.

FIGS. 11E and 11F are fragmentary diagrammatic views of the multigate device, in portion or entirety according to various aspects of the present disclosure.

FIGS. 12F and 12G are fragmentary diagrammatic views of the multigate device, in portion or entirety according to various aspects of the present disclosure.

FIGS. 12H and 12I are fragmentary diagrammatic views of the multigate device, in portion or entirety according to various aspects of the present disclosure.

DETAILED DESCRIPTION

Figure 1:
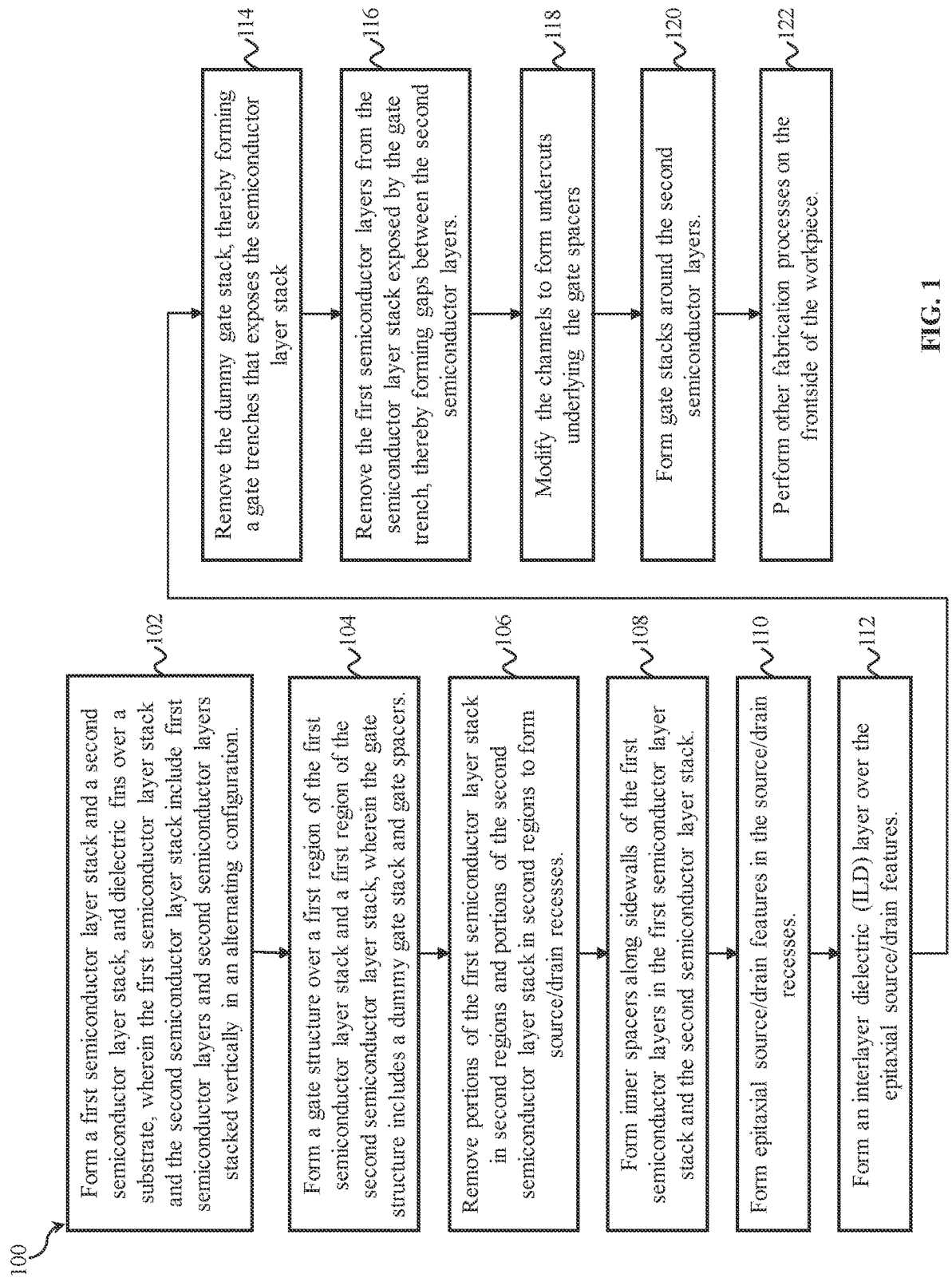
FIG. 1 is a flowchart of a method for fabricating a multigate device according to various aspects of the present disclosure.

The present disclosure relates generally to integrated circuit devices, and more particularly, to multigate devices, such as gate-all-around (GAA) devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" encompasses the dimension range from 4.5 nm to 5.5 nm.

FIG. 1 illustrates a flowchart of a method 100 for fabricating a multi-gate device according to various aspects of the present disclosure. In some embodiments, method 100 fabricates a multi-gate device that includes p-type GAA transistors and n-type GAA transistors. In some embodiments, method 100 fabricates a multi-gate device that includes first GAA transistors and second GAA transistors with different characteristics, such as different functions (e.g., logic device or memory device) or different conductivity type (e.g., n-type transistor or p-type transistor). In the disclosed structure and the method making the same, device structure, especially profiles of source/drain (S/D) features, are designed differently to optimize respective device performance, including reduced parasitic capacitance and reduced contact resistance. Particularly, the GAA transistors include S/D features with a bar-like profile or lollipop-like profile for and adjacent airgap to collectively reduce the parasitic capacitance and the contact resistance according to various embodiments.

In some embodiments, method 100 fabricates a multi-gate device that includes p-type GAA transistors and n-type GAA transistors. At block 102, a first semiconductor layer stack and a second semiconductor layer stack are formed over a substrate. The first semiconductor layer stack and the second semiconductor layer stack include first semiconductor layers and second semiconductor layers stacked vertically in an alternating configuration. In some embodiments, the operation 102 includes depositing various semiconductor materials (such as alternatively silicon and silicon germanium); patterning the stacked semiconductor materials to form semiconductor fins (or fins); and form isolation features, such as shallow trench isolation features to isolate fins. A cladding layer may be formed on the sidewalls of the first and second semiconductor layer stacks. In some embodiments, dielectric fins may be formed on the substrate among the fins. Dielectric fins have similar profile as fins but consist dielectric material(s) with benefits, such as tuning the fin density. Particularly, the second semiconductor layers in the semiconductor layer stacks are formed with nonuniform composition along the vertical direction (thickness direction). At block 104, a gate structure is formed over a first region of the first semiconductor layer stack and a first region of the second semiconductor layer stack. The gate structure includes a dummy gate stack and gate spacers. A lightly doped drain (LDD) implantation may be implemented, and the cladding layer may be removed between the formation of the dummy gate and the gate spacers. At block 106, portions of the first semiconductor layer stack in second regions and portions of the second semiconductor layer stack in second regions are removed to form source/drain recesses. At block 108, inner spacers are formed along sidewalls of the first semiconductor layers in the first semiconductor layer stack and the second semiconductor layer stack. At block 110, epitaxial source/drain (S/D) features are formed in the source/drain recesses. Especially, the operation at block 110 is designed to form S/D features with desired profiles, air gaps and improved circuit performance, the details of which are further described later. At block 112, an interlayer dielectric (ILD) layer is formed over the epitaxial source/drain features. At block 114, the dummy gate stack is removed, thereby forming a gate trench that exposes the first semiconductor layer stack in a first gate region and the second semiconductor layer stack in a second gate region. At block 116, the first semiconductor layers are removed from the first semiconductor layer stack and the second semiconductor layer stack exposed by the gate trench, thereby forming gaps between the second semiconductor layers. At block 118, the second semiconductor layers are further modified by a suitable process, such as one or more etching steps, such that undercuts underlying gate spacers are formed. At block 120, gate stacks are formed in the gate trench around the second semiconductor layers in the first gate region and the second gate region, and are further extended into the undercuts as gate extensions. At block 122, other fabrication processes, including forming an interconnect structure, are performed on the workpiece. Additional steps can be provided before, during, and after method 100, and some of the steps described can be moved, replaced, or eliminated for additional embodiments of method 100. The discussion that follows illustrates various embodiments of nanowire-based (or nanostructure-based) integrated circuit devices that can be fabricated according to method 100.

FIGS. 2A-12A, FIGS. 2B-12B, FIGS. 2C-12C, and FIGS. 2D-12D are fragmentary diagrammatic views of a multigate device (or a workpiece) 200, in portion or entirety, at various fabrication stages (such as those associated with method 100 in FIG. 1) according to various aspects of the present disclosure. In particular, FIGS. 2A-12A are top views of multigate device 200 in an X-Y plane; FIGS. 2B-12B are diagrammatic cross-sectional views of multigate device 200 in an X-Z plane along lines B-B' respectively of FIGS. 2A-12A, FIGS. 2C-12C are diagrammatic cross-sectional views of multigate device 200 in a Y-Z plane along lines C-C' respectively of FIGS. 2A-12A; and FIGS. 2D-12D are diagrammatic cross-sectional views of multigate device 200 in the Y-Z plane along lines D-D' respectively of FIGS. 2A-12A.

Figure 2A:
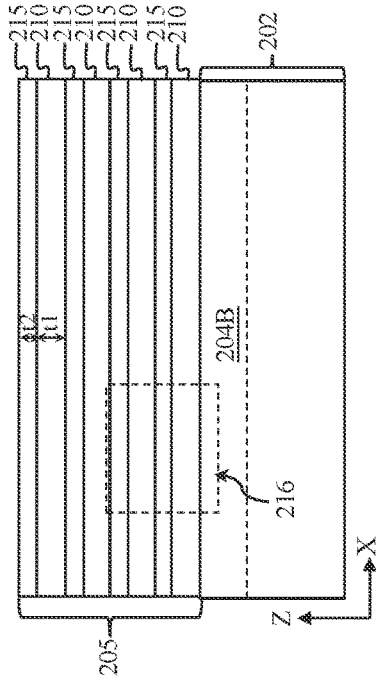
Figure 2B:
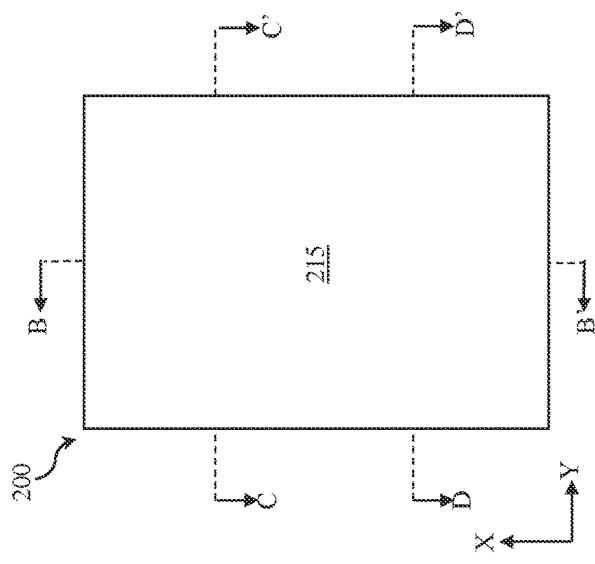
Figure 2C:
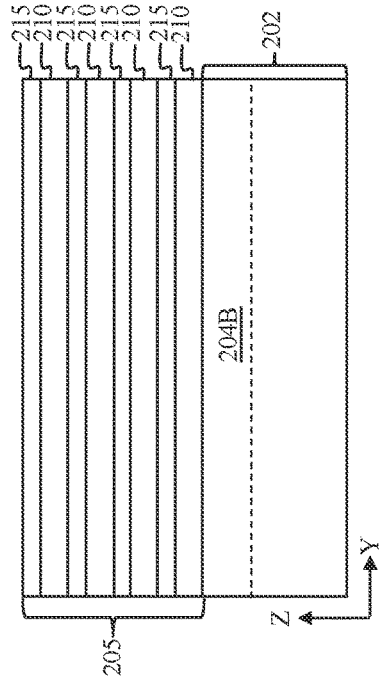
Figure 2D:
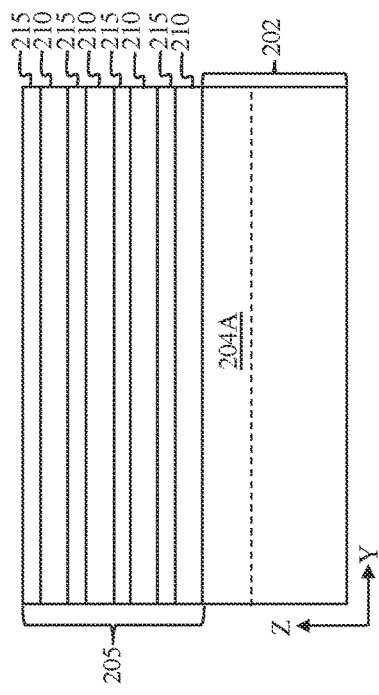
Figure 2E:
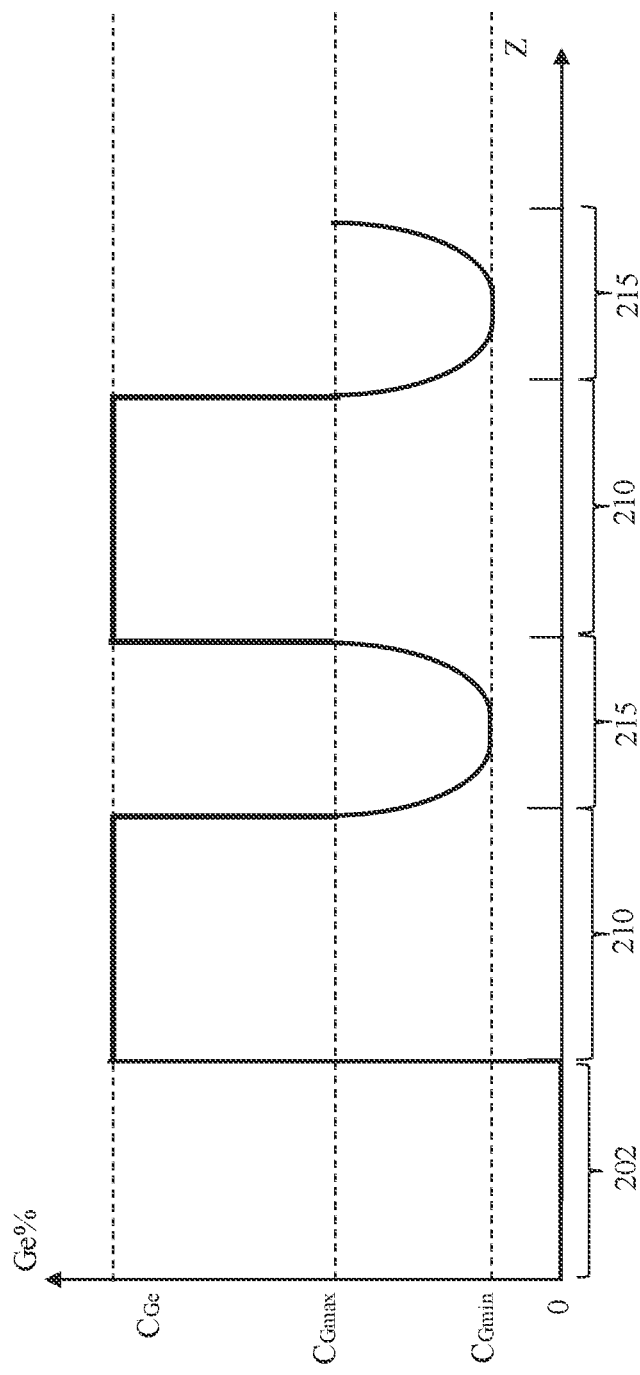
FIGS. 2E and 2F diagrammatically illustrate the composition of the semiconductor layers in the multigate device of FIGS. 2A-2D according to various aspects of the present disclosure.
Figure 2F:
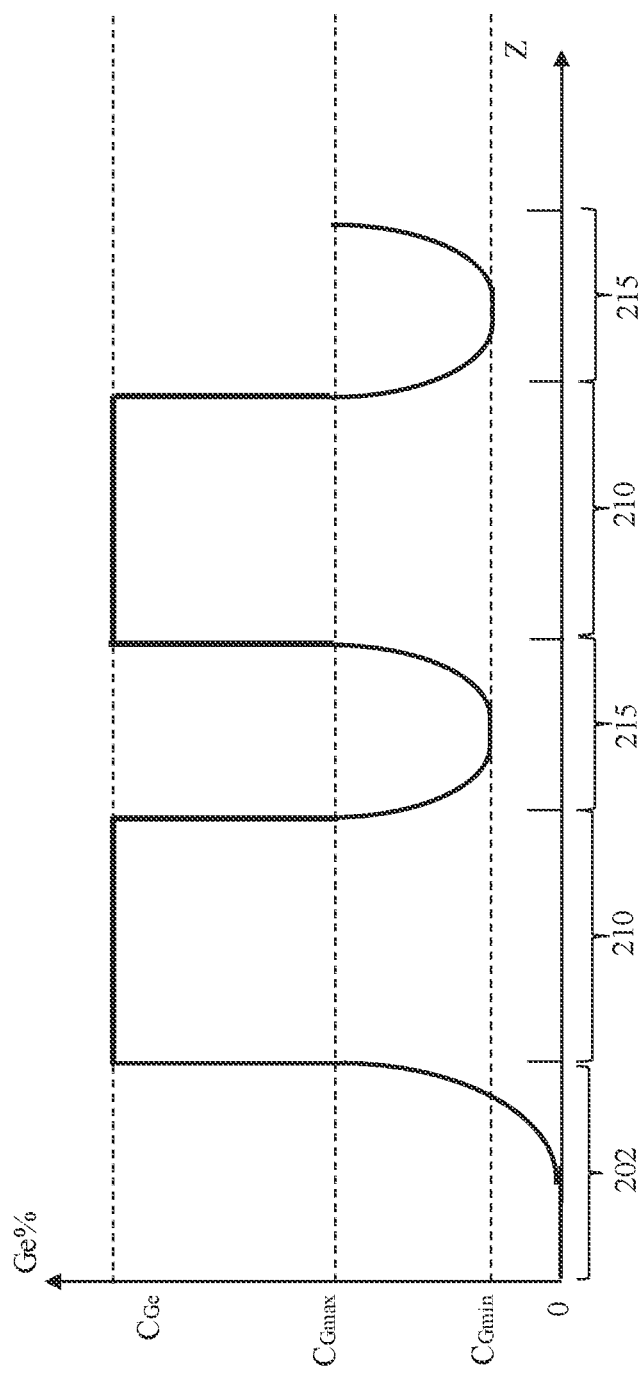

FIGS. 2E and 2F diagrammatically illustrate the composition of the semiconductor layers 215 according to various aspects of the present disclosure.

Figure 3A:
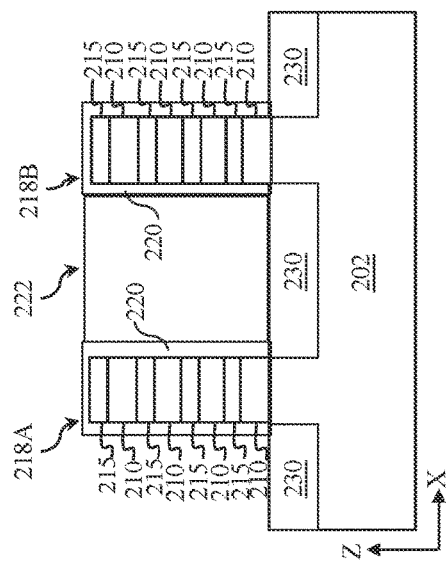
Figure 3B:
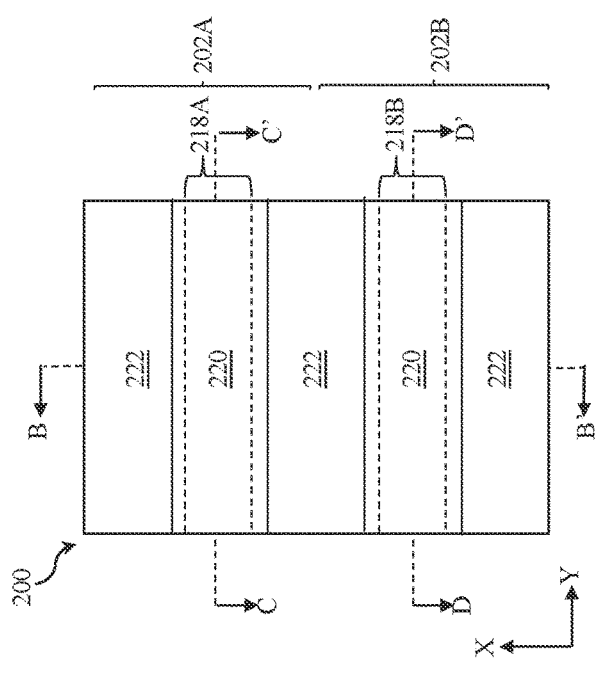
Figure 3C:
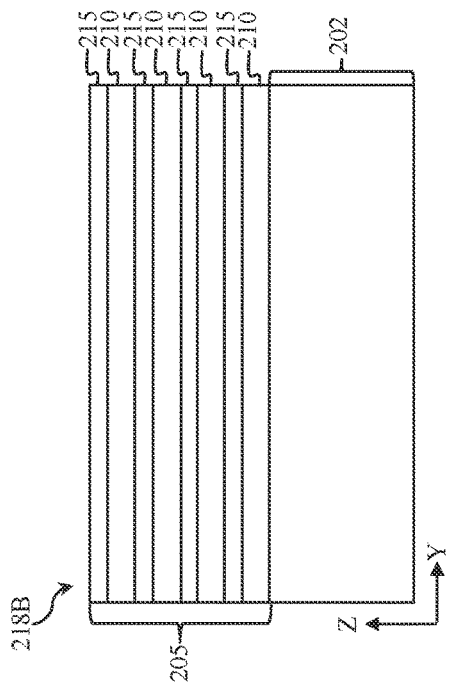
Figure 3D:
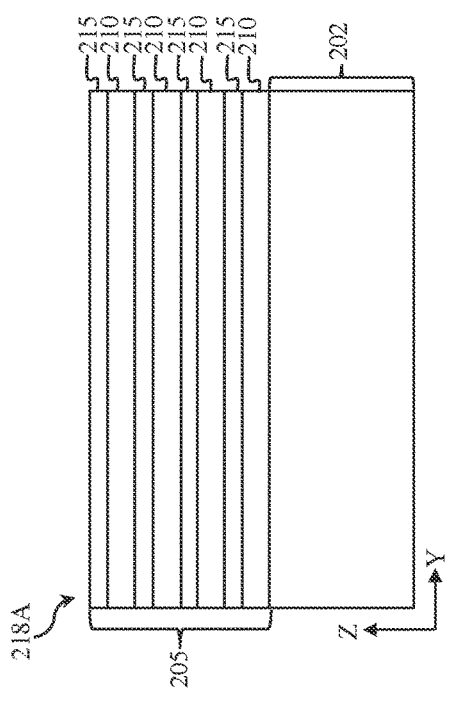
Figure 3F:
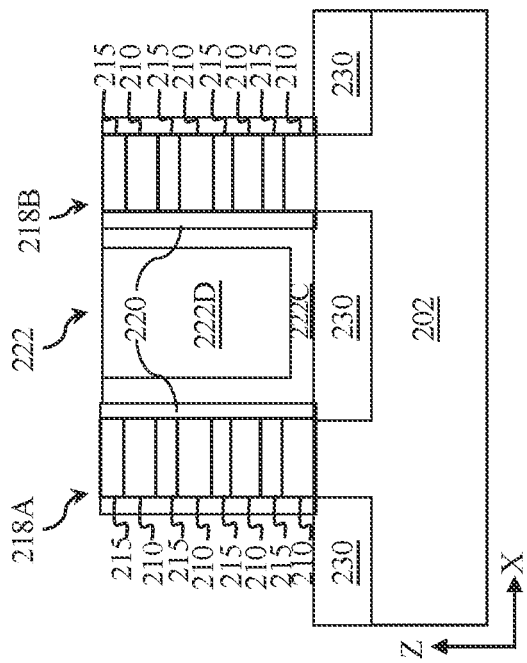
FIGS. 3E and 3F are fragmentary diagrammatic views of the multigate device, in portion or entirety according to various aspects of the present disclosure.
Figure 3E:
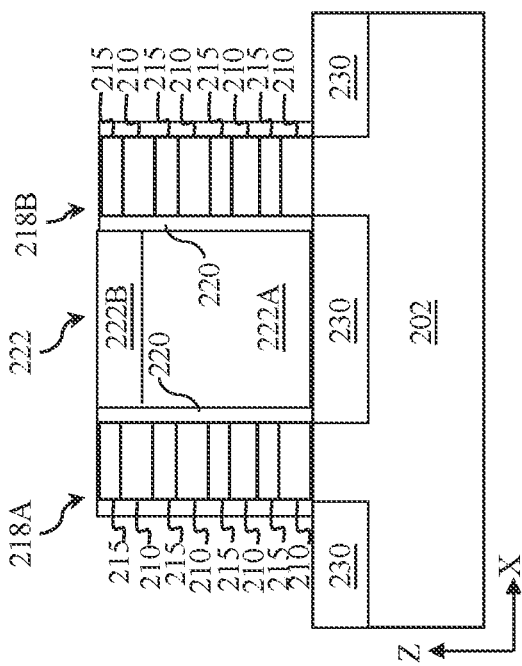
Figure 4A:
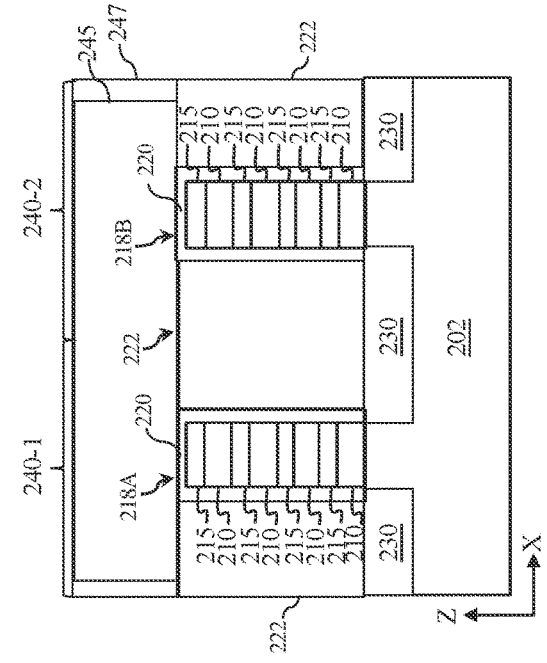
Figure 4B:
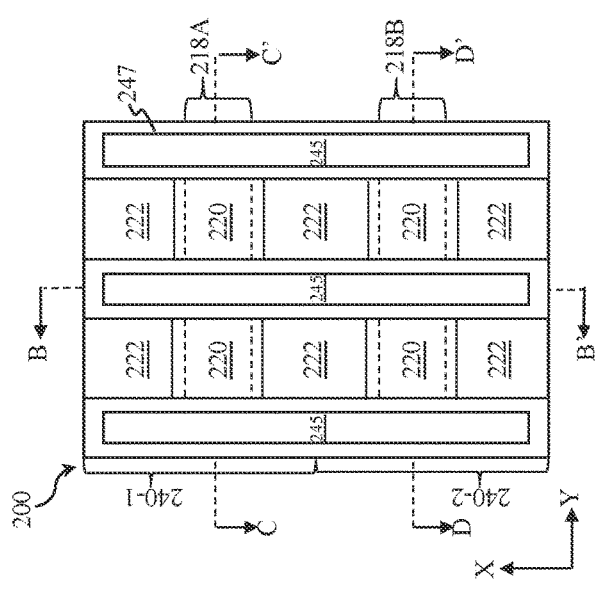
Figure 4C:
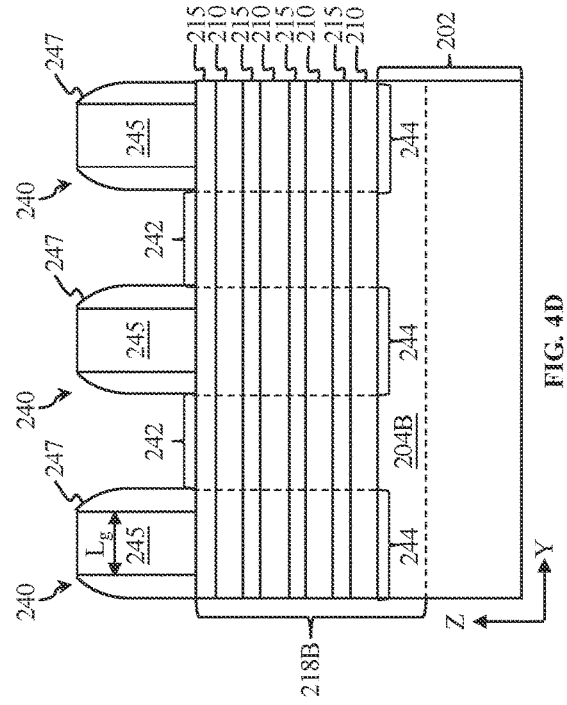
Figure 4D:
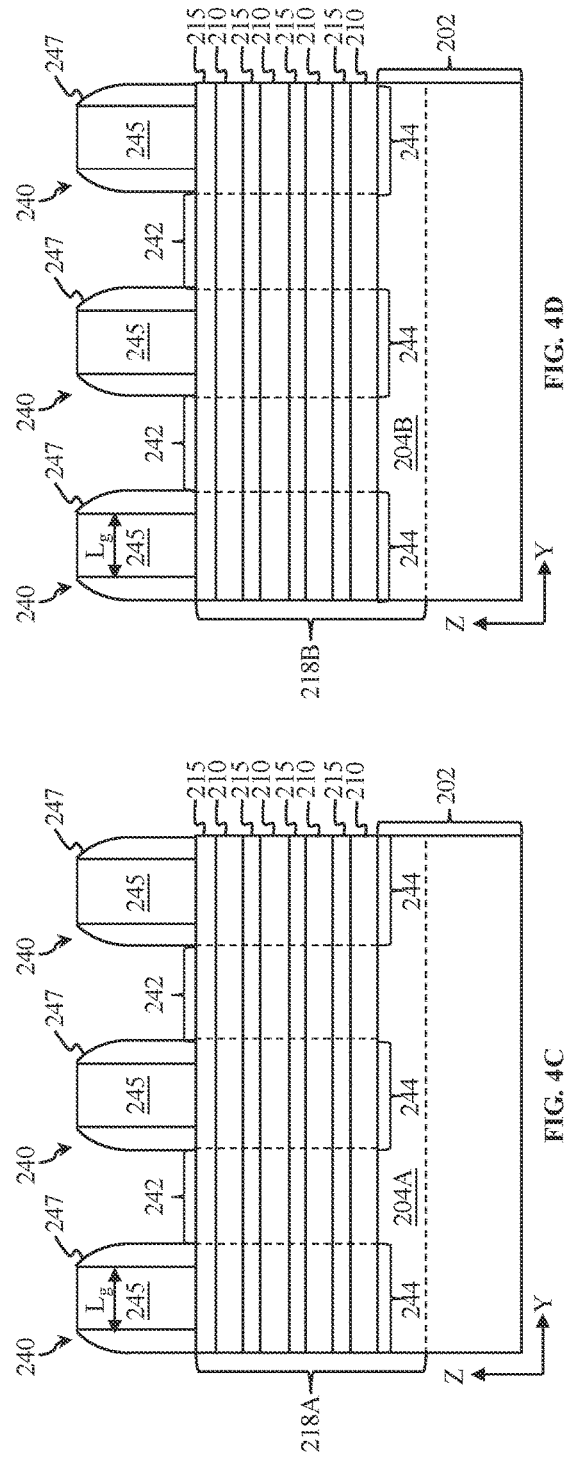
Figure 5A:
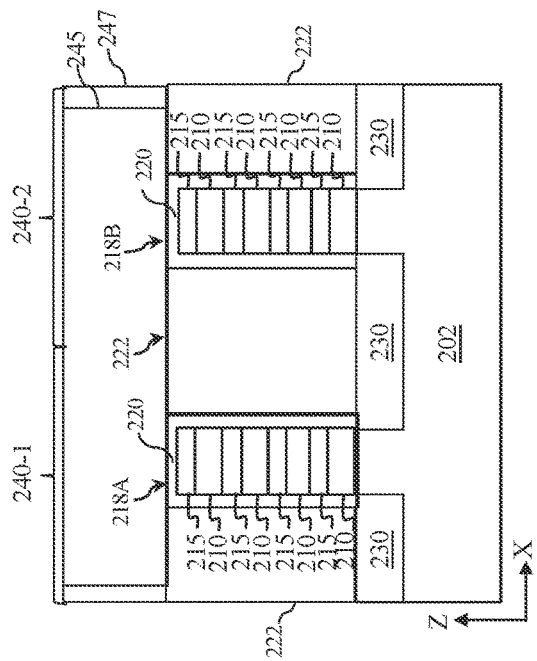
Figure 5B:
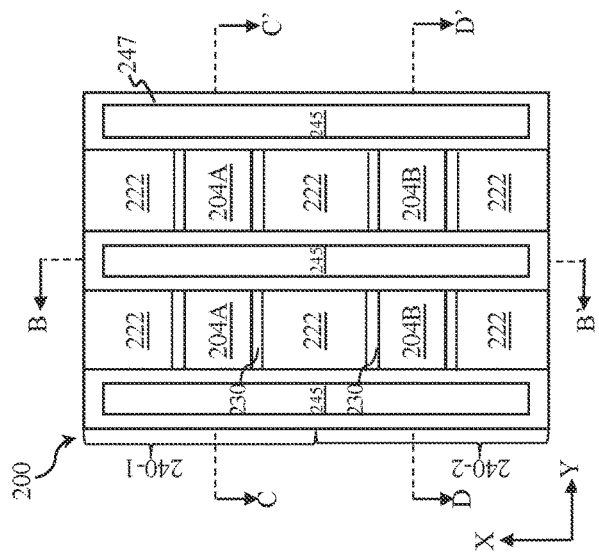
Figure 5C:
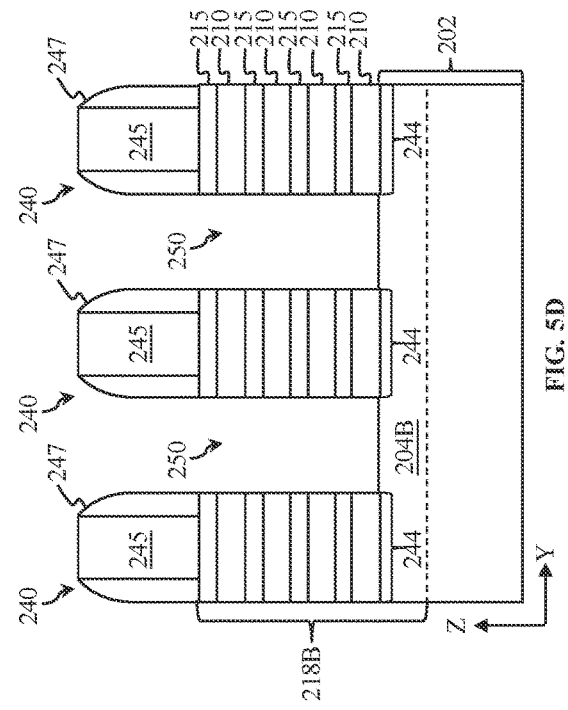
Figure 5D:
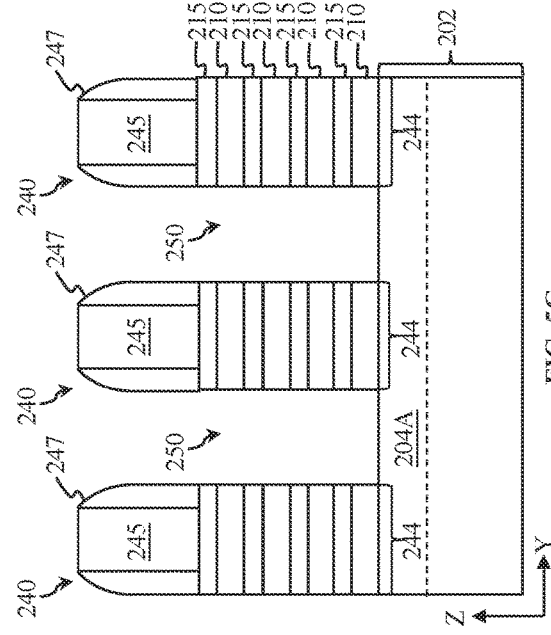
Figure 9B:
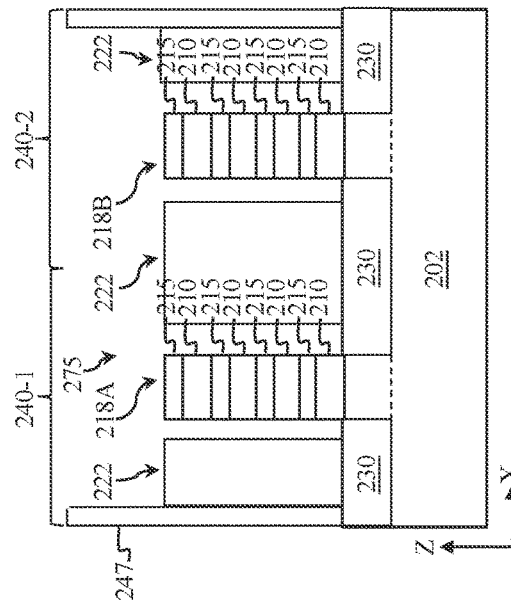
Figure 9D:
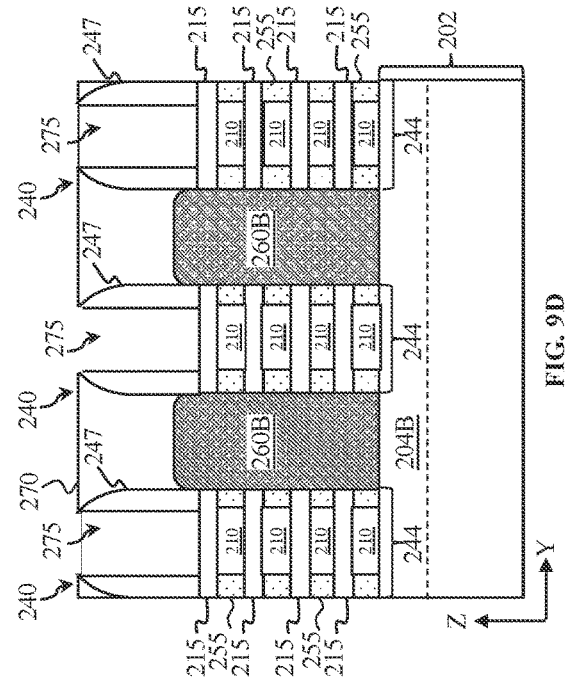
Figure 9A:
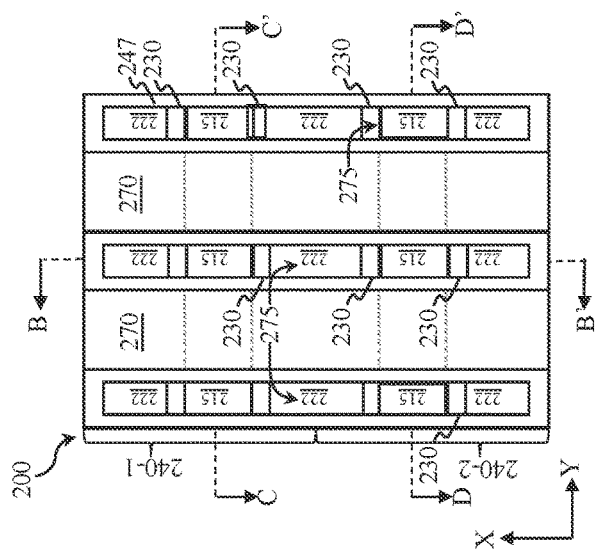
Figure 9C:
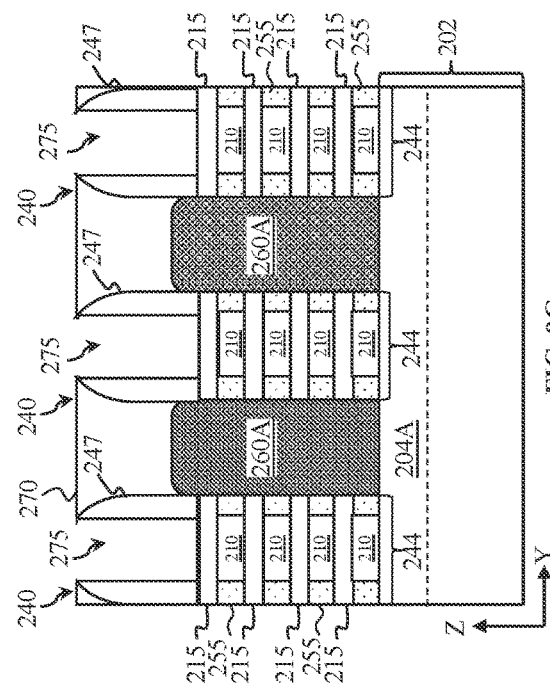
Figure 11B:
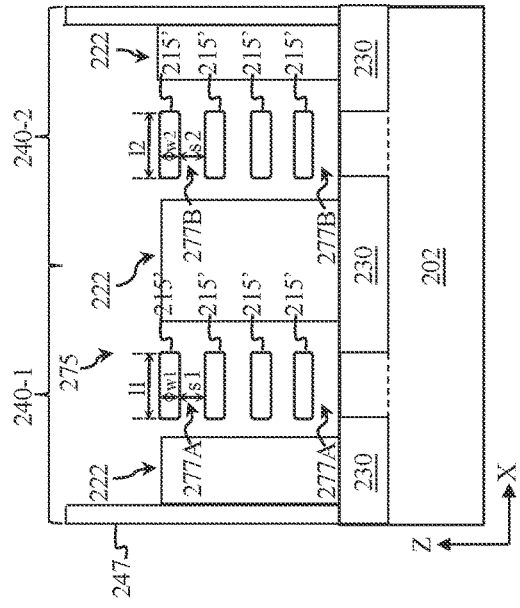
Figure 11D:
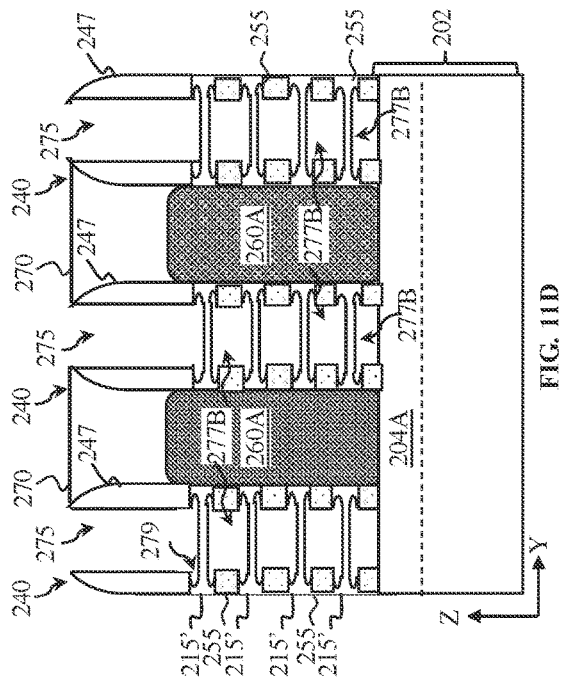
Figure 11A:
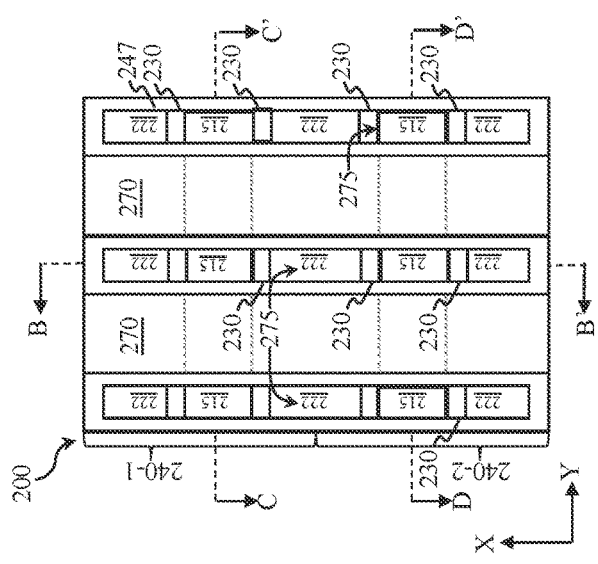
Figure 11C:
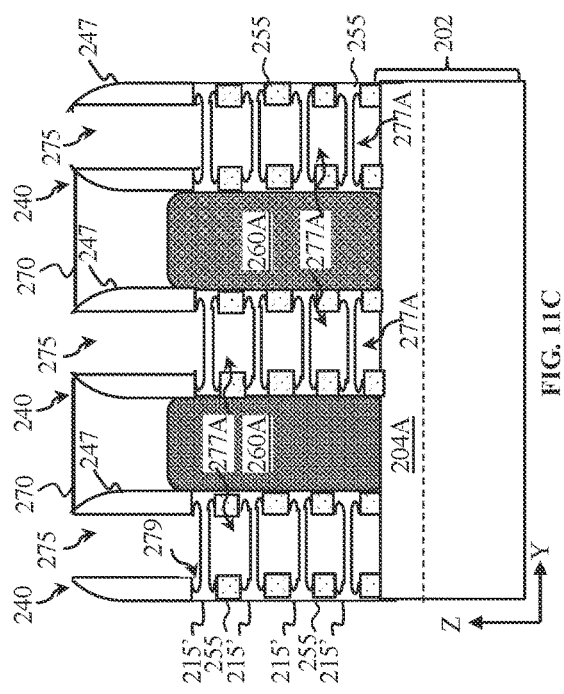

FIG. 3E, and FIG. 3F are fragmentary diagrammatic views of the multigate device 200, in portion or entirety according to various aspects of the present disclosure. In particular, each of FIG. 3E is a diagrammatic cross-sectional view of multigate device 200 in the X-Z plane along lines C-C' of FIG. 3A constructed according to various embodiments. FIG. 3F is a diagrammatic cross-sectional view of multigate device 200 in the X-Z plane along lines D-D' of FIG. 3A constructed according to various embodiments.

FIG. 10E is a fragmentary diagrammatic view of the multigate device 200 in the X-Z plane along lines B-B' of FIG. 10A; in portion or entirety according to various aspects of the present disclosure. FIG. 11E is a diagrammatic cross-sectional view of multigate device 200 in the Y-Z plane along lines C-C' of FIG. 11A; and FIG. 11F is a diagrammatic cross-sectional view of multigate device 200 in the Y-Z plane along lines D-D' respectively of FIG. 11A constructed according to various embodiments.

Figures 12A, 12B, 12C, 12D:
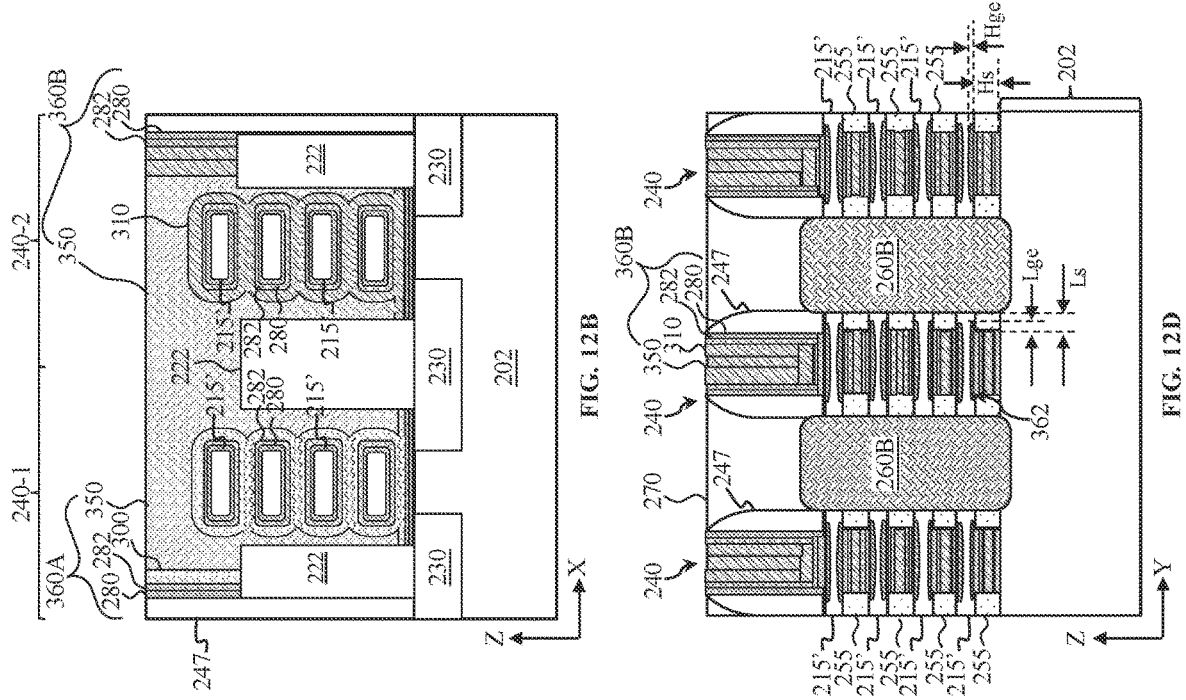
Figure 12E:
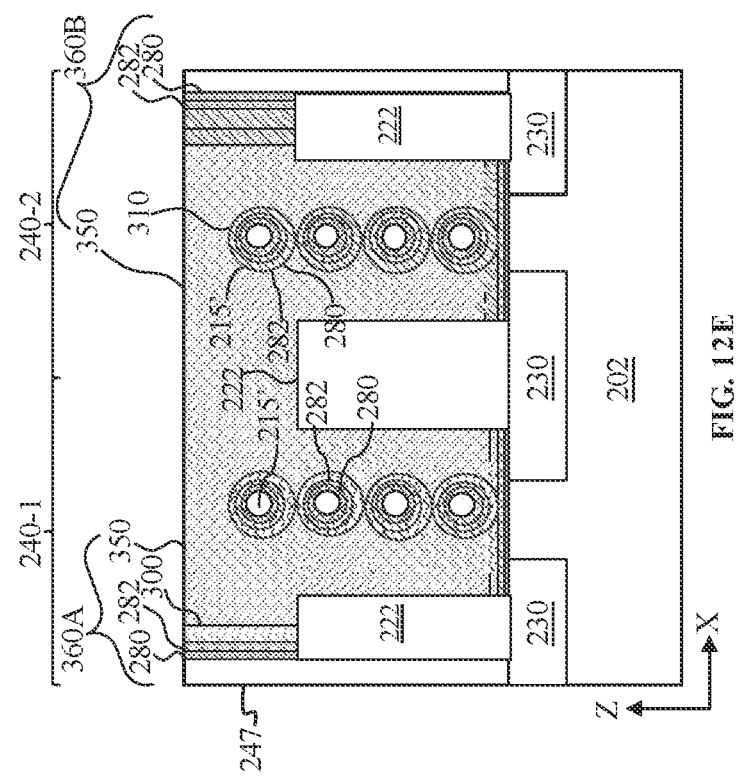
FIG. 12E is a fragmentary diagrammatic view of the multigate device, in portion or entirety according to various aspects of the present disclosure.
Figure 12K:
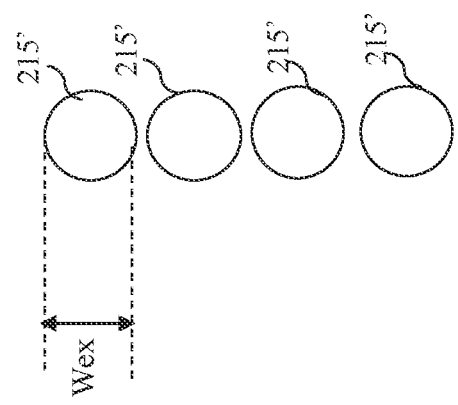
FIGS. 12J and 12K are fragmentary diagrammatic views of the multigate device, in portion or entirety according to various aspects of the present disclosure.
Figure 12J:
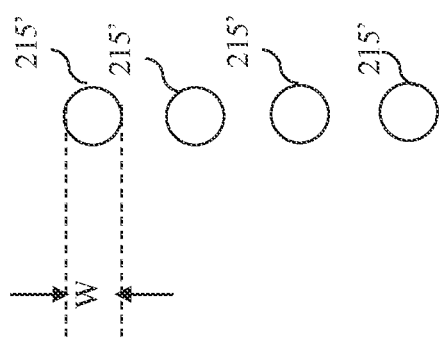

FIG. 12E is a fragmentary diagrammatic view of the multigate device 200 in the X-Z plane along lines B-B' of FIG. 12A; in portion or entirety according to various aspects of the present disclosure. FIG. 12F is a diagrammatic cross-sectional view of multigate device 200 in the Y-Z plane along lines C-C' of FIG. 12A; and FIG. 12G is a diagrammatic cross-sectional view of multigate device 200 in the Y-Z plane along lines D-D' respectively of FIG. 12A constructed according to various embodiments. FIG. 12H is a diagrammatic cross-sectional view of multigate device 200 in the X-Z plane along lines E-E' of FIG. 12C, in portion; and FIG. 12I is a diagrammatic cross-sectional view of multigate device 200 in the X-Z plane along lines F-F' respectively of FIG. 12C constructed according to various embodiments. FIG. 12J is a diagrammatic cross-sectional view of multigate device 200 in the X-Z plane along lines E-E' of FIG. 12C, in portion; and FIG. 12K is a diagrammatic cross-sectional view of multigate device 200 in the X-Z plane along lines F-F' respectively of FIG. 12C constructed according to various embodiments.

Multigate device 200 may be included in a microprocessor, a memory, and/or other IC device. In some embodiments, multigate device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multigate device 200 is included in a non-volatile memory, such as a non-volatile random-access memory (NVRAM), a flash memory, an electrically erasable programmable read only memory (EEPROM), an electrically programmable read-only memory (EPROM), other suitable memory type, or combinations thereof. Various figures have been simplified for the sake of clarity to better understand the inventive concepts of the present disclosure. Additional features can be added in multigate device 200, and some of the features described below can be replaced, modified, or eliminated in other embodiments of multigate device 200.

Turning to FIGS. 2A-2D, multigate device 200 includes a substrate (e.g., wafer) 202. In the depicted embodiment, substrate 202 includes silicon. Alternatively, or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of multigate device 200. The substrate 202 includes a first region 202A and a second region 202B. In the depicted embodiment, substrate 202 includes a p-type doped region 204A (referred to hereinafter as a p-well), which can be configured for n-type GAA transistors, and an n-type doped region 204B (referred to hereinafter as an n-well), which can be configured for p-type GAA transistors. N-type doped regions, such as n-well 204B, are doped with n-type dopants, such as phosphorus, arsenic, other n-type dopant, or combinations thereof. P-type doped regions, such as p-well 204A, are doped with p-type dopants, such as boron, indium, other p-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

A semiconductor layer stack 205 is formed over substrate 202, where semiconductor layer stack 205 includes semiconductor layers 210 and semiconductor layers 215 stacked vertically (e.g., along the z-direction) in an interleaving or alternating configuration from a surface of substrate 202. In some embodiments, semiconductor layers 210 and semiconductor layers 215 are epitaxially grown in the depicted interleaving and alternating configuration. For example, a first one of semiconductor layers 210 is epitaxially grown on substrate, a first one of semiconductor layers 215 is epitaxially grown on the first one of semiconductor layers 210, a second one of semiconductor layers 210 is epitaxially grown on the first one of semiconductor layers 215, and so on until semiconductor layers stack 205 has a desired number of semiconductor layers 210 and semiconductor layers 215. In such embodiments, semiconductor layers 210 and semiconductor layers 215 can be referred to as epitaxial layers. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 210 is different than a composition of semiconductor layers 215 to achieve etching selectivity and/or different oxidation rates during subsequent processing. In some embodiments, semiconductor layers 210 have a first etch rate to an etchant and semiconductor layers 215 have a second etch rate to the etchant, where the second etch rate is less than the first etch rate. In some embodiments, semiconductor layers 210 have a first oxidation rate and semiconductor layers 215 have a second oxidation rate, where the second oxidation rate is less than the first oxidation rate. In the depicted embodiment, semiconductor layers 210 and semiconductor layers 215 include different materials, constituent atomic percentages, constituent weight percentages, thicknesses, and/or characteristics to achieve desired etching selectivity during an etching process, such as an etching process implemented to form suspended channel layers in channel regions of multigate device 200. For example, where semiconductor layers 210 include silicon germanium and semiconductor layers 215 include silicon, a silicon etch rate of semiconductor layers 215 is less than a silicon germanium etch rate of semiconductor layers 210. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions of multigate device 200. In the depicted embodiment, semiconductor layer stack 205 includes four semiconductor layers 210 and four semiconductor layers 215 configured to form four semiconductor layer pairs disposed over substrate 202, each semiconductor layer pair having a respective first semiconductor layer 210 and a respective second semiconductor layer 215. After undergoing subsequent processing, such configuration will result in multigate device 200 having four channels. However, the present disclosure contemplates embodiments where semiconductor layer stack 205 includes more or less semiconductor layers, for example, depending on a number of channels desired for multigate device 200 (e.g., a GAA transistor) and/or design requirements of multigate device 200. For example, semiconductor layer stack 205 can include two to ten semiconductor layers 210 and two to ten semiconductor layers 215. In furtherance of the depicted embodiment, semiconductor layers 210 have a thickness t1 and semiconductor layers 215 have a thickness t2, where thickness t1 and thickness t2 are chosen based on fabrication and/or device performance considerations for multigate device 200. For example, thickness t1 can be configured to define a desired distance (or gap) between adjacent channels of multigate device 200 (e.g., between semiconductor layers 215), thickness t2 can be configured to achieve desired thickness of channels of multigate device 200, and both thickness t1 and thickness t2 can be configured to achieve desired performance of multigate device 200. In some embodiments, thickness t1 and thickness t2 are about 1 nm to about 10 nm.

The semiconductor layers 215 have nonuniform composition along the z-direction so that for applying an etching process to the semiconductor layers 215 with desired anisotropic etching, thereby modifying the semiconductor layers 215 to have a desired profile at a later fabrication stage, which will be described in detail later.

In some embodiments, the semiconductor layers 210 include silicon germanium with a substantial uniform composition (such as a uniform germanium concentration $C_{Ge}$) while the semiconductor layers 215 also include silicon germanium with germanium concentration nonuniformly distributed along the z-direction (thickness direction). Each of the semiconductor layers 215 has the highest germanium concentration $C_{Gmax}$ (atomic percentage) at both the top surface and the bottom surface and the lowest $C_{Gmin}$ in the middle level. The maximum concentration $C_{Gmax}$ is less than the germanium concentration $C_{Ge}$ of the semiconductor layers 210 and the minimum concentration $C_{Gmin}$ is less than $C_{Gmax}$, such as the minimum concentration $C_{Gmin}$ being zero in the present embodiment. The germanium concentration of the semiconductor layers 215 along X and Y directions is substantially uniform or constant. The dashed rectangle 216 in FIG. 2B includes portions of the semiconductor stack 205 (dashed rectangle includes two semiconductor layers 210 and two semiconductor layers 215) and a portion of the substrate 202. The germanium concentration Ge % of these two semiconductor layers along z-direction is illustrated in FIG. 2E, in which the horizontal axis represents position along z-direction and the vertical axis represents Ge % (atomic percentage) of the semiconductor material of the semiconductor stack 205 along z-direction. In some embodiments, the germanium concentration of the semiconductor layer 210 may also have variation but the lowest Ge % of the semiconductor layer 210 is substantially greater than the maximum germanium concentration $C_{Gmax}$ of the semiconductor layer 215. In some embodiments, the minimum concentration $C_{Gmin}$ is zero. The profile of the germanium concentration of the semiconductor stack 205 can be controlled by controlling the flowrates of the precursor of the epitaxial growth. In some embodiments, the precursor of the epitaxial growth includes $SiH_4$ and $GeH_4$ as silicon-containing chemical and germanium-containing chemical. The gas flow rates of $SiH_4$ and $GeH_4$ are dynamically controlled during the epitaxial growth to achieve the desired concentration profile. Assume that the flow rate of $GeH_4$ is $FR_{Ge}$ and the flow rate of $SiH_4$ is $FR_{Si}$. The flow rate $FR_{Ge}$ and the flow rate of $SiH_4$ simultaneously vary to achieve the desired germanium concentration.

In some embodiments, the semiconductor layers 210 include silicon germanium with a germanium concentration ranging between 25% and 30% (atomic percentage) while the semiconductor layers 215 includes silicon germanium with a gradient germanium concentration ranging between 0%-15% (atomic percentage). More particularly, the germanium concentration of each semiconductor layer 215 reaches the maximum concentration $C_{Gmax}$ at the top surface, vertically decreases along z-direction to the minimum concentration $C_{Gmin}$ at the middle of the semiconductor layer 215, and vertically increases along z-direction from the minimum concentration $C_{Gmin}$ to reach the maximum concentration $C_{Gmax}$ at the bottom surface. In the depicted embodiments, the germanium concentration $C_{Ge}$ of each semiconductor layer 210 ranges between 25% and 30% while the semiconductor layer 215 includes the maximum concentration $C_{Gmax}$ ranging between 5% and 15%, and the minimum concentration $C_{Gmin}$ at zero. In furtherance of the embodiments, the semiconductor layer 215 includes a certain thickness of pure silicon or 0% germanium. For example, the thickness of the pure silicon of the semiconductor layer 215 over the total thickness of the semiconductor layer 215 ranges between 25% and 50%. In this case, the gas supply during the epitaxial growth is controlled such that both $SiH_4$ and $GeH_4$ flow rates are dynamically varied. The flow rate of $GeH_4$ is $FR_{Ge}$ and the flow rate of $SiH_4$ is $FR_{Si}$. During growing one semiconductor layer 215, the flow rate of $SiH_4$ remains about 100 sccm, and the flow rate $FR_{Ge}$ is initially 30 sccm~40 sccm; then continuously varies to 0 sccm; and then continuously varies to 30 sccm~40 sccm, thereby completing the formation of one semiconductor layer 215.

In some embodiments, the semiconductor layers 210 include silicon germanium with a germanium concentration is greater than 30%, such as ranging between 35% and 40% (atomic percentage) while the semiconductor layers 215 includes silicon germanium with a gradient germanium concentration ranging between 18%-30% (atomic percentage). More particularly, the germanium concentration of each semiconductor layer 215 reaches the maximum concentration $C_{Gmax}$ at the top surface, vertically decreases along z-direction to the minimum concentration $C_{Gmin}$ at the middle of the semiconductor layer 215, and vertically increases along z-direction from the minimum concentration $C_{Gmin}$ to reach the minimum concentration $C_{Gmin}$ at the bottom surface. In the depicted embodiments, the germanium concentration $C_{Ge}$ of each semiconductor layer 210 ranges between 35% and 40% while the semiconductor layer 215 includes the maximum concentration $C_{Gmax}$ ranging between 23% and 30%, and the minimum concentration $C_{Gmin}$ ranging between 18% and 25%. In this case, the gas supply during the epitaxial growth is controlled such that both $SiH_4$ and $GeH_4$ flow rates are dynamically varied. During growing one semiconductor layer 215, the flow rate of SiH$_4$ remains about 100 sccm, and the flow rate FR$_{Ge}$ is initially 50 sccm~60 sccm; then continuously varies to 10 sccm~20 sccm, and then continuously varies to 50 sccm~60 sccm, thereby completing the formation of one semiconductor layer 215.

In some embodiments, in addition to having a gradient germanium concentration of the semiconductor layer 215, the substrate 202 also includes germanium with gradient concentration, as illustrated in FIG. 2F. The substrate 202 starts with a silicon substrate and further includes a selective epitaxial grown thin silicon germanium layer on top. In some embodiments, the thin silicon germanium layer has a thickness similar or equal to the thickness of the semiconductor layer 215. The thin silicon germanium layer has a gradient germanium concentration and reaches the highest germanium concentration at top, such as the highest germanium concentration being equal to C$_{GMax}$ or ranging between 25% and 30%. In some embodiments, the thin silicon germanium layer of the substrate 202 has the highest germanium concentration ranging between 25% and 30%, the gas supply during the epitaxial growth is controlled such that both SiH$_4$ and GeH$_4$ flow rates are dynamically varied, in which the flow rate of SiH$_4$ remains about 100 sccm, and the flow rate FR$_{Ge}$ is initially 0 sccm; and then continuously increases to 30 sccm~40 sccm.

In some embodiments, in addition to having a gradient germanium concentration of the semiconductor layer 215, the substrate 202 is a silicon germanium substrate with gradient concentration, as illustrated in FIG. 2F. The substrate 202 starts with a silicon germanium substrate and further includes a selective epitaxial grown thin silicon germanium layer on top. In some embodiments, the thin silicon germanium layer has a thickness similar or equal to the thickness of the semiconductor layer 215. The thin silicon germanium layer has a gradient germanium concentration, starting with the lowest germanium concentration (such as ranging between 20% and 25%), increasing the germanium concentration, and reaching the highest germanium concentration (such as 45% and 50%) at top. In the depicted embodiment that the thin silicon germanium layer of the substrate 202 has the lowest germanium concentration ranging between 20% and 25%, and the highest germanium concentration ranging between 45% and 50%, the gas supply during the epitaxial growth is controlled such that both SiH$_4$ and GeH$_4$ flow rates are dynamically varied, in which the flow rate of SiH$_4$ remains about 100 sccm, and the flow rate FR$_{Ge}$ is initially 10 sccm~20 sccm; and then continuously increases to 50 sccm~60 sccm.

In various embodiments described above, the gas low rates are illustrated according to some examples. Those ranges are not intended to be limiting. For example, the gas flow rates of SiH$_4$ and GeH$_4$ may be proportionally changed according to individual situations. For examples, the flow rate of SiH$_4$ is 100 sccm, and the flow rate FR$_{Ge}$ is 10 sccm~20 sccm. The gas flow may be changes such that the flow rate of SiH$_4$ is 200 sccm, and the flow rate FR$_{Ge}$ is 20 sccm~40 sccm.

Turning to FIGS. 3A-3F, semiconductor layer stack 205 is patterned to form a fin 218A and a fin 218B (also referred to as fin structures, fin elements, etc.). Fins 218A, 218B include a substrate portion (i.e., a portion of substrate 202) and a semiconductor layer stack portion (i.e., a remaining portion of semiconductor layer stack 205 including semiconductor layers 210 and semiconductor layers 215). Fins 218A, 218B extend substantially parallel to one another along a y-direction, having a length defined in the y-direction, a width defined in an x-direction, and a height defined in a z-direction. In some implementations, a lithography and/or etching process is performed to pattern semiconductor stack 205 to form fins 218A, 218B. The lithography process can include forming a resist layer over semiconductor layer stack 205 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 205 using the patterned resist layer as an etch mask. In some embodiments, the patterned resist layer is formed over a hard mask layer disposed over semiconductor layer stack 205, a first etching process removes portions of the hard mask layer to form a patterned hard mask layer, and a second etching process removes portions of semiconductor layer stack 205 using the patterned hard mask layer as an etch mask. The etching process can include a dry etching process, a wet etching process, other suitable etching process, or combinations thereof. In some embodiments, the etching process is a reactive ion etching (RIE) process. After the etching process, the patterned resist layer (and, in some embodiments, a hard mask layer) is removed, for example, by a resist stripping process or other suitable process. Alternatively, fins 218A, 218B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented while patterning semiconductor layer stack 205. Further, in some embodiments, the exposure process can implement maskless lithography, electron-beam (e-beam) writing, and/or ion-beam writing for patterning the resist layer.

An isolation feature(s) 230 is formed over and/or in substrate 202 to isolate various regions, such as various device regions, of multigate device 200. For example, isolation features 230 surround a bottom portion of fins 218A, 218B, such that isolation features 230 separate and isolate fins 218A, 218B from each other. In the depicted embodiment, isolation features 230 surround the substrate portion of fins 218A, 218B (e.g., doped regions 204A, 204B of substrate 202) and partially surround the semiconductor layer stack portion of fins 218A, 218B (e.g., a portion of bottommost semiconductor layer 210). However, the present disclosure contemplates different configurations of isolation features 230 relative to fins 218A, 218B. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. For example, isolation features 230 can include STI features that define and electrically isolate fins 218A, 218B from other active device regions (such as fins) and/or passive device regions. STI features can be formed by etching a trench in substrate 202 (for example, by using a dry etching process and/or a wet etching process) and filling the trench with insulator material (for example, by using a CVD process or a spin-on glass process). A chemical mechanical polishing (CMP) process may be performed to remove excessive insulator material and/or planarize a top surface of isolation features 230. In another example, STI features can be formed by depositing an insulator material over substrate 202 after forming fins 218A, 218B (in some implementations, such that the insulator material layer fills gaps (trenches) between fins 218A, 218B) and etching back the insulator material layer to form isolation features 230. In some embodiments, STI features include a multi-layer structure that fills the trenches, such as a silicon nitride layer disposed over a thermal oxide liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

In some embodiments, a cladding layer 220 is formed on the sidewalls of the fins 218A, 218B by a suitable method, such as selective epitaxial growth. The cladding layer 220 may include a semiconductor material similar to that of the first semiconductor layers 210 in composition. In the depicted embodiment, the cladding layer 220 includes silicon germanium. The cladding layer 220 provides paths to etch the first semiconductor layers 210 and is removed with the first semiconductor layers 210 during a channel-release process at later stage (to be described below). The cladding layer 220 may present on the top surface of the fins according to some embodiments.

In some embodiments, dielectric fins 222 may are formed among the fins 218. The dielectric fins 222 are dielectric features of one or more dielectric material. Only one dielectric fin 222 is illustrated in FIG. 3B. More dielectric fins 222 may be present, such as one on left side of the fin 218A and another one on right side of the fin 218B, such as those illustrated in FIG. 4B and other figures. The dielectric fin 222 may be formed by any suitable method that including deposition. In some embodiments, the dielectric fin 222 includes a dielectric stack 222A and a self-aligned cap 222B disposed on the dielectric stack 222A and aligned with the dielectric stack 222A, as illustrated in FIG. 3E. In furtherance of the embodiment, the dielectric fin 222 is formed by a procedure that includes a deposition of one or more dielectric material to fill in the gap between the fins 218; performing a chemical mechanical polishing (CMP) process; selectively etching to recess the deposited dielectric material; depositing another dielectric material and performing another CMP process to form the dielectric stack 222A and the self-aligned cap 222B. In some embodiments, the dielectric fin 222 includes a conformal dielectric layer 222C and a bulk dielectric layer 222D disposed on the conformal dielectric layer 222C, as illustrated in FIG. 3F. In furtherance of the embodiment, the dielectric fin 222 is formed by a procedure that includes a conformal deposition of one or more dielectric material in the gap between the fins 218 and depositing another dielectric material on the conformal dielectric layer 222C to fill in the gap between the fins 218; and performing a CMP process. In some embodiments, the hard mask used to pattern semiconductor stacks 205 may be removed at this stage. Thus, the dielectric fin 222 is extended above the fins 218.

Turning to FIGS. 4A-4D, gate structures 240 are formed over portions of fins 218A, 218B, over dielectric fin 222, and over isolation features 230. Gate structures 240 extend lengthwise in a direction that is different than (e.g., orthogonal to) the lengthwise direction of fins 218A, 218B. For example, gate structures 240 extend substantially parallel to one another along the x-direction, having a length defined in the y-direction, a width defined in the x-direction, and a height defined in the z-direction. Gate structures 240 are disposed on portions of fins 218A, 218B and define source/drain regions 242 and channel regions 244 of fins 218A, 218B. In the X-Z plane, gate structures 240 wrap top surfaces and sidewall surfaces of fins 218A, 218B. In the Y-Z plane, gate structures 240 are disposed over top surfaces of respective channel regions 244 of fins 218A, 218B, such that gate structures 240 interpose respective source/drain regions 242. Each gate structure 240 includes a gate region 240-1 that corresponds with a portion of the respective gate structure 240 that will be configured for an n-type GAA transistor (and thus corresponds with a portion spanning an n-type GAA transistor region) and a gate region 240-2 that corresponds with a portion of the respective gate structure 240 that will be configured for a p-type GAA transistor (and thus corresponds with a portion spanning a p-type GAA transistor region). Gate structures 240 may be configured differently in gate region 240-1 and gate region 240-2, depending on the transistors to be formed on these regions, such as p-type transistors or n-type transistors. For example, each of gate structures 240 spans gate region 240-1 and gate region 240-2 and may be configured differently in gate region 240-1 and gate region 240-2 to optimize performance of the n-type GAA transistors (having n-gate electrodes in gate regions 240-1) and the p-type GAA transistors (having p-gate electrodes in gate regions 240-2). Accordingly, gate regions 240-1 will be referred to as n-type gate regions 240-1 and gate regions 240-2 will be referred to as p-type gate regions 240-2 hereinafter.

In FIGS. 4A-4D, each gate structure 240 includes a dummy gate stack 245. In the depicted embodiment, a width of dummy gate stacks 245 defines a gate length ($L_g$) of gate structures 240 (here, in the y-direction), where the gate length defines a distance (or length) that current (e.g., carriers, such as electrons or holes) travels between source/drain regions 242 when the n-type GAA transistor and/or the p-type GAA transistor are switched (turned) on. In some embodiments, the gate length is about 5 nm to about 250 nm. Gate length can be tuned to achieve desired operation speeds of the GAA transistors and/or desired packing density of the GAA transistors. For example, when a GAA transistor is switched on, current flows between source/drain regions of the GAA transistor. Increasing the gate length increases a distance required for current to travel between the source/drain regions, increasing a time it takes for the GAA transistor to switch fully on. Conversely, decreasing the gate length decreases the distance required for current to travel between the source/drain regions, decreasing a time it takes for the GAA transistor to switch fully on. Smaller gate lengths provide GAA transistors that switch on/off more quickly, facilitating faster, high speed operations. Smaller gate lengths also facilitate tighter packing density (i.e., more GAA transistors can be fabricated in a given area of an IC chip), increasing a number of functions and applications that can be fabricated on the IC chip. In the depicted embodiment, the gate length of one or more of gate structures 240 is configured to provide GAA transistors having short-length channels. For example, the gate length of GAA transistors is about 5 nm to about 20 nm. In some embodiments, multigate device 200 can include GAA transistors having different gate lengths.

Dummy gate stacks 245 include a dummy gate electrode, and in some embodiments, a dummy gate dielectric. The dummy gate electrode includes a suitable dummy gate material, such as polysilicon layer. In embodiments where dummy gate stacks 245 include a dummy gate dielectric disposed between the dummy gate electrode and fins 218A, 218B, the dummy gate dielectric includes a dielectric material, such as silicon oxide, a high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some embodiments, the dummy gate dielectric includes an interfacial layer (including, for example, silicon oxide) disposed over fins 218A, 218B and a high-k dielectric layer disposed over the interfacial layer. Dummy gate stacks 245 can include numerous other layers, for example, capping layers, interface layers, diffusion layers, barrier layers, hard mask layers, or combinations thereof. For example, dummy gate stacks 245 can further include a hard mask layer disposed over the dummy gate electrode.

Dummy gate stacks 245 are formed by deposition processes, lithography processes, etching processes, other suitable processes, or combinations thereof. For example, a deposition process is performed to form a dummy gate electrode layer over fins 218A, 218B and isolation features 230. In some embodiments, a deposition process is performed to form a dummy gate dielectric layer over fins 218A, 218B and isolation features 230 before forming the dummy gate electrode layer. In such embodiments, the dummy gate electrode layer is deposited over the dummy gate dielectric layer. In some embodiment, a hard mask layer is deposited over the dummy gate electrode layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the dummy gate electrode layer (and, in some embodiments, the dummy gate dielectric layer and the hard mask layer) to form dummy gate stacks 245, such that dummy gate stacks 245 (including the dummy gate electrode layer, the dummy gate dielectric layer, the hard mask layer, and/or other suitable layers) is configured as depicted in FIGS. 4A-4D. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

In some embodiments, a lightly doped source/drain (LDD) implantation process may be applied to the semiconductor stacks 205 to form LDD features (not shown) aligned with edges of the gate stacks 245. LDD features are separately formed for n-type GAA transistors and p-type GAA transistors. For example, LDD features for n-type GAA transistors includes n-type dopant, such as phosphorous while LDD features for p-type GAA transistors includes p-type dopant, such as boron. In some embodiments, an etching process may be applied to selectively remove the cladding layer 220 at this stage or after the formation of the gate spacers 247.

Each gate structure 240 further includes gate spacers 247 disposed adjacent to (i.e., along sidewalls of) respective dummy gate stacks 245. Gate spacers 247 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 245 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 245. In such implementations, the various sets of spacers can include materials having different etch rates. For example, a first dielectric layer including silicon and oxygen (e.g., silicon oxide) can be deposited and etched to form a first spacer set adjacent to dummy gate stacks 245, and a second dielectric layer including silicon and nitrogen (e.g., silicon nitride) can be deposited and etched to form a second spacer set adjacent to the first spacer set. Note that the workpiece 200 illustrated in FIGS. 4A-4D and subsequent figures includes more dielectric fins 222. It is not intended to be limiting, and more or less dielectric fins 222 may be present according to different embodiments.

Turning to FIGS. 5A-5D, exposed portions of fins 218A, 218B (i.e., source/drain regions 242 of fins 218A, 218B that are not covered by gate structures 240) are at least partially removed to form source/drain trenches (recesses) 250. In the depicted embodiment, an etching process completely removes semiconductor layer stack 205 in source/drain regions 242 of fins 218A, 218B, thereby exposing the substrate portion of fins 218A, 218B in source/drain regions 242 (e.g., p-well 204A and n-well 204B). Source/drain trenches 250 thus have sidewalls defined by remaining portions of semiconductor layer stack 205, which are disposed in channel regions 244 under gate structures 240, and bottoms defined by substrate 202, such as top surfaces of p-well 204A and n-well 204B in source/drain regions 242. In some embodiments, the etching process removes some, but not all, of semiconductor layer stack 205, such that source/drain trenches 250 have bottoms defined by semiconductor layer 210 or semiconductor layer 215 in source/drain regions 242. In some embodiments, the etching process further removes some, but not all, of the substrate portion of fins 218A, 218B, such that source/drain recesses 250 extend below a topmost surface of substrate 202. The etching process can include a dry etching process, a wet etching process, other suitable etching process, or combinations thereof. In some embodiments, the etching process is a multi-step etch process. For example, the etching process may include alternative etchants to separately and alternately remove semiconductor layers 210 and semiconductor layers 215. In some embodiments, parameters of the etching process are configured to selectively etch semiconductor layer stack with minimal (to no) etching of gate structures 240 (i.e., dummy gate stacks 245 and gate spacers 247) and/or isolation features 230. In some embodiments, a lithography process, such as those described herein, is performed to form a patterned mask layer that covers gate structures 240 and/or isolation features 230, and the etching process uses the patterned mask layer as an etch mask. In some embodiments, the patterned mask layer used to form dummy gate stacks 245 remains and is used as an etch mask to recess the source/drain regions 242.

Turning to FIGS. 6A-6D, inner spacers 255 are formed in channel regions 244 along sidewalls of semiconductor layers 210 by any suitable process. Particularly, the inner spacers 255 are formed to be vertically aligned with gate spacers 247 (and the LDD features if present) to provide isolation and separation between the gate structure and the source/drain features. For example, a first etching process is performed that selectively etches semiconductor layers 210 exposed by source/drain trenches 250 with minimal (to no) etching of semiconductor layers 215, such that gaps are formed between semiconductor layers 215 and between semiconductor layers 215 and substrate 202 under gate spacers 247. Portions (edges) of semiconductor layers 215 are thus suspended in the channel regions 244 under gate spacers 247. In some embodiments, the gaps extend partially under dummy gate stacks 245. The first etching process is configured to laterally etch (e.g., along the y-direction) semiconductor layers 210, thereby reducing a length of semiconductor layers 210 along the y-direction. The first etching process is a dry etching process, a wet etching process, other suitable etching process, or combinations thereof. A deposition process then forms a spacer layer over gate structures 240 and over features defining source/drain trenches 250 (e.g., semiconductor layers 215, semiconductor layers 210, and substrate 202), such as CVD, PVD, ALD, HDPCVD, MOCVD, RPCVD, PECVD, LPCVD, ALCVD, APCVD, plating, other suitable methods, or combinations thereof. The spacer layer partially (and, in some embodiments, completely) fills the source/drain trenches 250. The deposition process is configured to ensure that the spacer layer fills the gaps between semiconductor layers 215 and between semiconductor layers 215 and substrate 202 under gate spacers 247. A second etching process is then performed that selectively etches the spacer layer to form inner spacers 255 as depicted in FIGS. 6A-6D with minimal (to no) etching of semiconductor layers 215, dummy gate stacks 245, and gate spacers 247. In some embodiments, the spacer layer is removed from sidewalls of gate spacers 247, sidewalls of semiconductor layers 215, dummy gate stacks 245, and substrate 202. The spacer layer (and thus inner spacers 255) includes a material that is different than a material of semiconductor layers 215 and a material of gate spacers 247 to achieve desired etching selectivity during the second etching process. In some embodiments, the spacer layer includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the spacer layer includes a low-k dielectric material, such as those described herein. In some embodiments, dopants (for example, p-type dopants, n-type dopants, or combinations thereof) are introduced into the dielectric material, such that spacer layer includes a doped dielectric material.

Turning to FIGS. 7A-7D, epitaxial source/drain features are formed in source/drain recesses 250. For example, a semiconductor material is epitaxially grown from portions of substrate 202 and semiconductor layers 215 exposed by source/drain recesses 250, forming epitaxial source/drain (S/D) features 260A in source/drain regions 242 that correspond with n-type GAA transistor regions and epitaxial source/drain features 260B in source/drain regions 242 that correspond with p-type GAA transistor regions. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202 and/or semiconductor layer stack 205 (in particular, semiconductor layers 215). Epitaxial source/drain features 260A, 260B are doped with n-type dopants and/or p-type dopants. In some embodiments, for the n-type GAA transistors, epitaxial source/drain features 260A include silicon. Epitaxial source/drain features 260A can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for the p-type GAA transistors, epitaxial source/drain features 260B include silicon germanium or germanium. Epitaxial source/drain features 260B can be doped with boron, other p-type dopant, or combinations thereof (for example, forming Si:Ge:B epitaxial source/drain features). In some embodiments, epitaxial source/drain features 260A and/or epitaxial source/drain features 260B include more than one epitaxial semiconductor layer, where the epitaxial semiconductor layers can include the same or different materials and/or dopant concentrations. In some embodiments, epitaxial source/drain features 260A, 260B include materials and/or dopants that achieve desired tensile stress and/or compressive stress in respective channel regions 244. In some embodiments, epitaxial source/drain features 260A, 260B are doped during deposition by adding impurities to a source material of the epitaxy process (i.e., in-situ). In some embodiments, epitaxial source/drain features 260A, 260B are doped by an ion implantation process subsequent to a deposition process. In some embodiments, annealing processes (e.g., rapid thermal annealing (RTA) and/or laser annealing) are performed to activate dopants in epitaxial source/drain features 260A, 260B and/or other source/drain regions (for example, heavily doped source/drain regions and/or lightly doped source/drain (LDD) regions). In some embodiments, epitaxial source/drain features 260A, 260B are formed in separate processing sequences that include, for example, masking p-type GAA transistor regions when forming epitaxial source/drain features 260A in n-type GAA transistor regions and masking n-type GAA transistor regions when forming epitaxial source/drain features 260B in p-type GAA transistor regions.

In some embodiments, the source/drain features 260A and 260B may be engineered to have desired shapes and sizes by tuning the etching process that forms the source/drain recesses 250 and the epitaxial growth to form the source/drain features 260A/260B.

In some embodiments, the deposition (epitaxial growth) chemical in the precursor may include silane ($SiH_4$) or dichlorosilane ($SiH_2Cl_2$) for growing silicon, $GeH_4$ for growing germanium, or both for growing silicon germanium. The precursor also includes chemical for dopant, such as phosphorous-containing chemical for n-type dopant or boron-containing chemical for p-type dopant. In the present embodiment, the precursor for n-type source/drain features 260A includes $SiH_4$ and a phosphorous-containing chemical to form the n-type source/drain features 260A of silicon doped with phosphorous. The precursor for epitaxial growth may additionally include etching chemical to control the epitaxial growth and the profile of the source/drain features. In some embodiments, the etching chemical includes HCl. In some embodiments, the etching chemical includes chlorine-containing chemical, such as HCl or $Cl_2$, or fluorine-containing chemical, such as $SF_6$, or alternatively both chlorine-containing chemical and fluorine-containing chemical.

In some embodiments, the epitaxial growth is designed with a lower deposition/etching (D/E) ratio to achieve a desired source/drain profile, the etching gas in the precursor uses HCl with a flow rate greater than 30000 sccm, or a flow rate ranging between 40000 sccm~30000 sccm. Thus, the epitaxial growth is a bottom-up deposition, thereby forming the source/drain features with a geometry having substantial vertical sidewalls. In some embodiments, the epitaxial growth is designed with a higher ratio D/E to achieve a different profile, the etching gas in the precursor uses HCl with a flow rate less than 10000 sccm, or ranging between 0 sccm~10000 sccm, the epitaxial growth forms the source/drain features with a profile having uneven sidewalls.

Turning to FIGS. 8A-8D, an inter-level dielectric (ILD) layer 270 is formed over isolation features 230, epitaxial source/drain features 260A, 260B, and gate spacers 247, for example, by a deposition process (such as CVD, PVD, ALD, HDPCVD, MOCVD, RPCVD, PECVD, LPCVD, ALCVD, APCVD, plating, other suitable methods, or combinations thereof). ILD layer 270 is disposed between adjacent gate structures 240. In some embodiments, ILD layer 270 is formed by a flowable CVD (FCVD) process that includes, for example, depositing a flowable material (such as a liquid compound) over multigate device 200 and converting the flowable material to a solid material by a suitable technique, such as thermal annealing and/or ultraviolet radiation treating. ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In the depicted embodiment, ILD layer 270 is a dielectric layer that includes a low-k dielectric material (generally referred to as a low-k dielectric layer). ILD layer 270 can include a multilayer structure having multiple dielectric materials. In some embodiments, a contact etch-stop layer (CESL) is disposed between ILD layer 270 and isolation features 230, epitaxial source/drain features 260A, 260B, and gate spacers 247. The CESL includes a material different than ILD layer 270, such as a dielectric material that is different than the dielectric material of ILD layer 270. For example, where ILD layer 270 includes a low-k dielectric material, the CESL includes silicon and nitrogen, such as silicon nitride or silicon oxynitride. Subsequent to the deposition of ILD layer 270 and/or the CESL, a CMP process and/or other planarization process can be performed until reaching (exposing) a top portion (or top surface) of dummy gate stacks 245. In some embodiments, the planarization process removes hard mask layers of dummy gate stacks 245 to expose underlying dummy gate electrodes of dummy gate stacks 245, such as polysilicon gate electrode layers.

ILD layer 270 may be a portion of a multilayer interconnect (MLI) feature disposed over substrate 202. The MLI feature electrically couples various devices (for example, p-type GAA transistors and/or n-type GAA transistors of multigate device 200, transistors, resistors, capacitors, and/or inductors) and/or components (for example, gate structures and/or epitaxial source/drain features of p-type GAA transistors and/or n-type GAA transistors), such that the various devices and/or components can operate as specified by design requirements of multigate device 200. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of multigate device 200 and/or distribute signals (for example, clock signals, voltage signals, and/or ground signals) to the devices and/or the components of multigate device 200.

Turning to FIGS. 9A-9D, dummy gate stacks 245 are removed from gate structures 240 by a suitable etching process, thereby resulting in gate trenches 275 and exposing semiconductor layer stacks 205 of fins 218A, 218B in n-type gate regions 240-1 and p-type gate regions 240-2. The etching process is designed with etchant to selectively remove the dummy gate stacks 245. In the depicted embodiment, an etching process completely removes dummy gate stacks 245 to expose semiconductor layers 215 and semiconductor layers 210 in channel regions 244. The etching process is a dry etching process, a wet etching process, other suitable etching process, or combinations thereof. In some embodiments, the etching process is a multi-step etch process. For example, the etching process may include alternative etchants to separately remove various layers of dummy gate stacks 245, such as the dummy gate electrode layers, the dummy gate dielectric layers, and/or the hard mask layers. In some embodiments, the etching process is configured to selectively etch dummy gate stacks 245 with minimal (to no) etching of other features of multigate device 200, such as ILD layer 270, gate spacers 247, isolation features 230, semiconductor layers 215, and semiconductor layers 210. In some embodiments, a lithography process, such as those described herein, is performed to form a patterned mask layer that covers ILD layer 270 and/or gate spacers 247, and the etching process uses the patterned mask layer as an etch mask.

Turning to FIGS. 10A-10D, semiconductor layers 210 of semiconductor layer stack 205 (exposed by gate trenches 275) are selectively removed from channel regions 244, thereby forming suspended semiconductor layers 215 in channel regions 244. In the depicted embodiment, an etching process selectively etches semiconductor layers 210 with minimal (to no) etching of semiconductor layers 215 and, in some embodiments, minimal (to no) etching of gate spacers 247 and/or inner spacers 255. Various etching parameters can be tuned to achieve selective etching of semiconductor layers 210, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of semiconductor layers 210 (in the depicted embodiment, silicon germanium) at a higher rate than the material of semiconductor layers 215 (in the depicted embodiment, silicon) (i.e., the etchant has a high etch selectivity with respect to the material of semiconductor layers 210). The etching process is a dry etching process, a wet etching process, other suitable etching process, or combinations thereof. In some embodiments, a dry etching process (such as an RIE process) utilizes a fluorine-containing gas (for example, $SF_6$) to selectively etch semiconductor layers 210. In some embodiments, a ratio of the fluorine-containing gas to an oxygen-containing gas (for example, $O_2$), an etching temperature, and/or an RF power may be tuned to selectively etch silicon germanium (or silicon). In some embodiments, a wet etching process utilizes an etching solution that includes ammonium hydroxide ($NH_4OH$) and water ($H_2O$) to selectively etch semiconductor layers 210. In some embodiments, a chemical vapor phase etching process using hydrochloric acid (HCl) selectively etches semiconductor layers 210.

At least one suspended semiconductor layer 215 is thus exposed in n-type gate regions 240-1 and p-type gate regions 240-2 by gate trenches 275. In the depicted embodiment, each n-type gate region 240-1 and each p-type gate region 240-2 includes four suspended semiconductor layers 215 vertically stacked that will provide four channels through which current will flow between respective epitaxial source/drain features (epitaxial source/drain features 260A or epitaxial source/drain features 260B) during operation of the GAA transistors. Suspended semiconductor layers 215 are thus referred to as channel layers 215' hereinafter. Channel layers 215' in n-type gate regions 240-1 are separated by gaps 277A, and channel layers 215' in p-type gate regions 240-2 are separated by gaps 277B, collectively being referred to as gaps 277. Channel layers 215' in n-type gate regions 240-1 are also separated from substrate 202 by gaps 277A, and channel layers 215' in p-type gate regions 240-2 are also separated by gaps 277B. A spacing s1 is defined between channel layers 215' along the z-direction in n-type gate regions 240-1, and a spacing s2 is defined between channel layers 215' along the z-direction in p-type gate regions 240-2. Spacing s1 and spacing s2 correspond with a width of gaps 277A and gaps 277B, respectively. In the depicted embodiment, spacing s1 is about equal to s2, though the present disclosure contemplates embodiments where spacing s1 is different than spacing s2. In some embodiments, spacing s1 and spacing s2 are both about equal to thickness t1 of semiconductor layers 210. Further, channel layers 215' in n-type gate regions 240-1 have a length l1 along the x-direction and a width w1 along the y-direction, and channel layers 215' in p-type gate regions 240-2 have a length l2 along the y-direction and a width w2 along the x-direction. In the depicted embodiment, length l1 is about equal to length l2, and width w1 is about equal to width w2, though the present disclosure contemplates embodiments where length l1 is different than length l2 and/or width w1 is different than width w2. In some embodiments, length l1 and/or length l2 is about 10 nm to about 50 nm. In some embodiments, width w1 and/or width w2 is about 4 nm to about 10 nm. In some embodiments, each channel layer 215' has nanometer-sized dimensions and can be referred to as a "nanowire," which generally refers to a channel layer suspended in a manner that will allow a metal gate to physically contact at least two sides of the channel layer, and in GAA transistors, will allow the metal gate to physically contact at least four sides of the channel layer (i.e., surround the channel layer). In such embodiments, a vertical stack of suspended channel layers can be referred to as a nanostructure, and the process depicted in FIGS. 10A-10D can be referred to as a channel nanowire release process. In some embodiments, after removing semiconductor layers 210, an etching process is performed to modify a profile of channel layers 215' to achieve desired dimensions and/or desired shapes (e.g., cylindrical-shaped (e.g., nanowire), rectangular-shaped (e.g., nanobar), sheet-shaped (e.g., nanosheet, etc., such as illustrated in FIG. 10B). The present disclosure further contemplates embodiments where the channel layers 215' (nanowires, as illustrated in FIG. 10E) have sub-nanometer dimensions depending on design requirements of multigate device 200. In furtherance of the embodiment where the channel layers 215' are nanowires, the length along x-direction and width along z-direction are substantially equal. For example, l1=w1 and l2=w2 with relative difference being less than 10%.

Turning to FIGS. 11A-11D, another etching process is applied to the channel layers 215', therefore modifying the channel layers 215' and forming undercuts (or extended gaps) 279 underlying the gate spacers 247. In other words, the gaps 277 are extended into the marginal regions directly underlying the gate spacers 247 and form extended gaps (or undercuts) 279. Those marginal regions are regions of the channels where the gate electrode has weaker or poor control. The extended gap 279 laterally extends to the marginal region directly underlying the gate spacer 247 but is not further extended to the corresponding source/drain feature to avoid direct contact and undesired shorting issues or reliability issues. The extended gap 279 is aligned with the gate spacer 247 and the inner spacer 255 in the top view. In some embodiments, the gate spacer 247 or inner spacer 255 spans a dimension Ls between the corresponding gate stack and the source/drain feature along y-direction while the undercut 279 spans a dimension Luc along y-direction. The ratio Luc/Ls is less than 50%, or ranges between 10% and 30% in some embodiments. In some embodiments, the inner spacer 255 vertically spans a dimension Hs along Z direction while the undercut 279 vertically spans a dimension Huc along z-direction. The ratio Huc/Hs is less than 30%, or ranges between 10% and 20% in some embodiments. In some embodiments, the vertical dimension Huc and the horizontal dimension Luc of the undercut 279 both range between 1 nm and 2 nm.

The undercuts 279 can be formed by the etching process due to the nonuniform composition of the semiconductor layers 215 (or the channel layers 215') as described above. The semiconductor layers 215 have a gradient composition along the z-direction. More specifically, the semiconductor layers 215 include silicon germanium with germanium concentration nonuniformly distributed along the z-direction (thickness direction). Each of the semiconductor layers 215 has the highest germanium concentration $C_{Gmax}$ (atomic percentage) at the top surface and the bottom surface and the lowest $C_{Gmin}$ in the middle level. The maximum concentration $C_{Gmax}$ is less than the germanium concentration of the semiconductor layers 210 and the minimum concentration $C_{Gmax}$ is zero or a concentration less than the highest germanium concentration $C_{Gmax}$. The germanium concentration of the semiconductor layers 215 along X and Y directions is substantially uniform. Various embodiments of the germanium composition distribution of the semiconductor layers 215 are described with reference to FIG. 2E. The etchant of the etching process is designed to have etch selectivity between silicon and germanium, or a higher etch rate to germanium and less etch rate to silicon. The etching process is started from the exposed top surface and bottom surface of the semiconductor layers 215. Therefore, the etching process has a higher etch rate laterally and lower etch rate vertically due to the nonuniform germanium composition of the semiconductor layers 215. In other words, the etching process is anisotropic with higher lateral etching effect, leading to undercuts 279 in corners.

In some embodiments, the etchant of the etching process to form the undercuts 279 includes $DIO_3$ and $NH_4OH$. $DIO_3$ is ozonated DI water (DI-O3 water) with function to oxidize silicon germanium while $NH_4OH$ is used to remove oxidized SiGe. Both chemicals may be mixed and simultaneously applied so that the silicon germanium is oxidized and removed. Alternatively, the etching process is a cyclic process wherein chemicals $DIO_3$ and $NH_4OH$ are alternatively applied in multiple cycles. Each cycle of the etching process includes oxidizing SiGe to form SiGe oxide by $DIO_3$; and removing the SiGe oxide by $NH_4OH$. The etching process is controlled with proper dimensions of the undercuts 279 without etching through by a suitable method, such as a number of cycles, supplies of the above chemicals in each cycle, or a combination thereof.

In some embodiments, the substrate 202 also includes germanium with a gradient concentration, such as those described in FIG. 2F. Accordingly, the etching process applied to the semiconductor layers 215 form additional undercuts 279 in the substrate 202 as well, as illustrated in FIGS. 11E and 11F. The additional undercuts 279 are similar to the undercuts 279 formed from the semiconductor layers 215 except for being formed on the substrate 202. For example, the additional undercuts 279 formed on the substrate 202 are laterally extended from the bottommost gaps 277 (277A or 277B) to the marginal regions directly underlying the bottommost inner spacers 255 with similar dimensions of the undercuts 279 associated with the semiconductor layers 215.

Turning to FIGS. 12A-12D, gate stacks 360A (for n-type transistors) and 360B (for p-type transistors) are formed over multigate device 200. Gate stacks 360A and 360B are collectively referred to as gate stacks 360. The gate stacks 360 are formed in the gate trenches 275, are extended down to wrap around each of the vertically stacked channel layers 215, and further laterally extended into the undercuts 279, thereby forming gate extensions 362 in the undercuts 279. The gate extensions 362 add additional gate control to the portions of the channel layers in corners, and therefore enhance the circuit performance of the GAA transistors, which includes increasing the on current Ion, decreasing the off current $I_{off}$, reducing the short channel effect, and reducing the subthreshold leakage.

The formation of the gate stacks includes deposition and planarization process, such as CMP. The gate stacks 360A and 360B may be collectively formed or alternatively, separately formed, depending on the type of GAA transistors, such as n-type GAA transistors or p-type GAA transistors. Accordingly, the gate stacks 360A and 360B may have the same compositions or alternatively different compositions, such as different work function metal layers (as described below). Each of the gate stacks 360A and 360B includes a gate dielectric layer and a gate electrode disposed on the gate dielectric layer. In some embodiments, the gate dielectric layer includes an interfacial layer 280 and a high-k dielectric layer disposed on the interfacial layer 208. The gate electrode may include one or more conductive materials, such as a capping layer, a work function metal layer, a blocking layer, a metal fill layer, and/or other proper conductive material layers. In some embodiments, the gate electrode includes a work function layer (such as 300 for the gate stack 360A or 310 for the gate stack 360B) and a metal fill layer 350 disposed on the work function metal layer. The work function layers 300 and 310 may be same or different and may be an n-type work function layer or a p-type work function layer, depending on the types of the corresponding GAA transistors.

In the depicted embodiment, the gate dielectric layer includes an interfacial layer 280 and a high-k dielectric layer 282, where interfacial layer 280 is disposed between the high-k dielectric layer 282 and channel layers 215'. In furtherance of the depicted embodiment, interfacial layer 280 and high-k dielectric layer 282 partially fill gaps 277A between channel layers 215' and between channel layers 215' and substrate 202 in the first gate region 240-1 and partially fill gaps 277B between channel layers 215' and between channel layers 215' and substrate 202 in the second gate region 240-2. In some embodiments, interfacial layer 280 and/or high-k dielectric layer 282 are also disposed on substrate 202, isolation features 230, and/or gate spacers 247. Interfacial layer 280 includes a dielectric material, such as $SiO_2$, HfSiO, SiON, other silicon-comprising dielectric material, other suitable dielectric material, or combinations thereof. High-k dielectric layer 282 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). Interfacial layer 280 is formed by any of the processes described herein, such as thermal oxidation, chemical oxidation, ALD, CVD, other suitable process, or combinations thereof. In some embodiments, interfacial layer 280 has a thickness of about 0.5 nm to about 3 nm. High-k dielectric layer 282 is formed by any of the processes described herein, such as ALD, CVD, PVD, oxidation-based deposition process, other suitable process, or combinations thereof. In some embodiments, high-k dielectric layer 282 has a thickness of about 1 nm to about 2 nm.

The work function layer (300 or 310) is formed over multigate device 200, particularly over high-k dielectric layer 282. For example, an ALD process conformally deposits the work function layer on high-k dielectric layer 282, such that the work function layer has a substantially uniform thickness and partially fills gate trenches 275. The work function layer can be formed using another suitable deposition process, such as CVD, PVD, HDPCVD, MOCVD, RPCVD, PECVD, LPCVD, ALCVD, APCVD, spin coating, plating, other deposition process, or combinations thereof. For example, the work function layer is disposed along sidewalls, tops, and bottoms of channel layers 215'. A thickness of the work function layer is configured to at least partially fill gaps (277A or 277B) between channel layers 215' and between channel layers 215' and substrate 202 (and, in some embodiments, without filling gate trenches 275 along the gate length direction (here, along the y-direction)). In some embodiments, the work function layer has a thickness of about 1 nm to about 10 nm. In some embodiments, p-type work function layer includes any suitable p-type work function material, such as TiN, TaN, TaSN, Ru, Mo, Al, WN, WCN, $ZrSi_2$, $MoSi_2$, $TaSi_2$, $NiSi_2$, other p-type work function material, or combinations thereof. In the depicted embodiment, p-type work function layer includes titanium and nitrogen, such as TiN. In some embodiments, the n-type work function layer includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. In the depicted embodiment, n-type work function layer includes aluminum.

A metal fill (or bulk) layer 350 is formed over multigate device 200, particularly over the work function layer 300 in the first gate regions 240-1 and over the work function layer 310 in the second gate regions 240-2. For example, a CVD process or a PVD process deposits metal fill layer 350 such that metal fill layer 350 fills any remaining portion of gate trenches 275, including any remaining portions of gaps (277A or 277B) in the gate regions 240-1 and 240-2. Metal fill layer 350 includes a suitable conductive material, such as Al, W, and/or Cu. Metal fill layer 350 may additionally or collectively include other metals, metal oxides, metal nitrides, other suitable materials, or combinations thereof. Alternatively, metal fill layer 350 is formed using another suitable deposition process, such as ALD, CVD, PVD, HDPCVD, MOCVD, RPCVD, PECVD, LPCVD, ALCVD, APCVD, spin coating, plating, other deposition process, or combinations thereof. In the depicted embodiment, the metal fill layer 350 is formed by PVD to form a seed layer and followed by plating to completely form the metal fill layer. Particularly, the undercuts 279 have enough spaces so that one or more conductive material of the gate electrodes are filled therein in addition to the gate dielectric layer. In some embodiments, the work function layer 300/310 is filled in the corresponding undercuts 279. In some embodiments, the work function layer 300/310 and the metal fill layer 350 are filled in the corresponding undercuts 279.

A planarization process is performed to remove excess gate materials from multigate device 200. For example, a CMP process is performed until a top surface of ILD layer 270 is reached (exposed), such that a top surface of gate structures 240 are substantially planar with a top surface of ILD layer 270 after the CMP process. Accordingly, multigate device 200 includes first GAA transistors having a gate stack 360A wrapping respective channel layers 215', such that gate stack 360A is disposed between respective epitaxial source/drain features 260A, and second GAA transistor having metal gate stacks 360B wrapping respective channel layers 215', such that metal gates 360B are disposed between respective epitaxial source/drain features 260B.

Other embodiments may present. As described above, the channel layers 215' of multigate device 200 may have different structure, such as nanosheet illustrated in FIG. 12B or nanowire illustrated in FIG. 12E. In FIG. 12E, the vertical dimension w and horizontal dimension between source/drain features of the channel layer 215' are substantially equal, such as l1=w1 and l2=w2.

In some embodiments, the substrate 202 also includes silicon germanium with gradient germanium concentration, the undercuts 279 are formed on the substrate 202 underlying the bottommost inner spacers 255, as illustrated in FIGS. 11E and 11F. Accordingly, additional gate extensions 362 are also formed on the substrate 202 and underlying the bottommost inner spacers 255, as illustrated in FIGS. 12F and 12G.

The gate extensions 362 have similar locations and dimensions to the extended gaps 279 since the gate extensions 362 are formed in the corresponding extended gaps 279. The gate extensions 362 are designed with dimensions for sufficient gate control effect and minimized circuit performance and reliability issues, such as shorting between the gate stack and the source/drain features. More particularly, the gate extensions 362 are aligned with the gate spacer 247 and the inner spacer 255 in the top view. In some embodiments, each of the gate spacers 247 or inner spacer 255 spans a dimension Ls between the corresponding gate stack and the source/drain feature along y-direction while each of the gate extensions 362 spans a dimension Lge along y-direction. The ratio Lge/Ls is less than 50%, or ranges between 10% and 30% in some embodiments. In some embodiments, each of the inner spacers 255 vertically spans a dimension Hs along z-direction while each of the gate extensions 362 vertically spans a dimension Hge along z-direction. The ratio Hge/Hs is less than 30%, or ranges between 10% and 20% in some embodiments. In some embodiments, the vertical dimension Hge and the horizontal dimension Lge of the gate extension 362 both range between 1 nm and 2 nm.

Such formed gate stacks 360 each include different dimensions at different locations, as illustrated in FIGS. 12H, 12I, 12J and 12K. FIGS. 12H and 12I are sectional views of the multigate device 200, in portion, cut along the dashed lines EE' and FF' of FIG. 12C, respectively, constructed in accordance with some embodiments. FIGS. 12J and 12K are sectional views of the multigate device 200, in portion, cut along the dashed lines EE' and FF' of FIG. 12C, respectively, constructed in accordance with other embodiments. Specifically, FIGS. 12H, 12I, 12J and 12K. only illustrate the channel layers 215'. In FIG. 12H, the channel layers 215' have a dimension W along z-direction, such as w1 in the first region 202A or w2 in the second region 202B. In FIG. 12I, the portions of the channel layers 215' extended around the inner spacers 255 have a dimension Wex along z-direction, which is greater than W. (Wex-W)/2>1 nm according to some examples. In other embodiments where the channel layers 215' are nanowires, the channel layers 215' have a different profile, such as a round shape according to some embodiments. In FIG. 12J, the channel layers 215' have a dimension W along z-direction, such as w1 in the first region 202A or w2 in the second region 202B. In FIG. 12K, the portions of the channel layers 215' extended around the inner spacers 255 have a dimension Wex along z-direction, Wex is greater than W, such as (Wex-W)/2 being greater than 1 nm. In some embodiments, a ratio W/Wex is less than 50% or ranges between 30% and 40%. Those configurations are designed to ensure substantial enhancement of the control of the gate extension to the channels and also to ensure enough isolation between the gate and the S/D features.

Fabrication can proceed to continue fabrication of multigate device 200. For example, various contacts can be formed to facilitate operation of the n-type GAA transistors and the p-type GAA transistors. For example, one or more ILD layers, similar to ILD layer 270, and/or CESL layers can be formed over substrate 202 (in particular, over ILD layer 270 and gate structures 240). Contacts can then be formed in ILD layer 270 and/or ILD layers disposed over ILD layer 270. For example, contacts are respectively electrically and/or physically coupled with gate structures 240 and contacts are respectively electrically and/or physically coupled to source/drain regions of the n-type GAA transistors and the p-type GAA transistors (particularly, epitaxial source/drain features 260A, 260B). Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 270 and the contacts (for example, extending through ILD layer 270 and/or the other ILD layers) are a portion of the MLI feature described above.

Other fabrication processes may be applied to the workpiece 200 and may implemented before, during, or after the processes described above, such as various processing steps to form an interconnect structure over the GAA transistors from the frontside of substrate 202 to electrically connects various circuit components including the first GAA transistors in the first region 202A and the second GAA transistors in the second region 202B. The interconnect structure includes metal lines distributed in multiple metal layers (such as 1$^{st}$ metal layer, 2$^{nd}$ metal layer, 3$^{rd}$ metal layer, and etc. from the bottom up to the top metal layer) to provide horizontal routing and contact features (between the substrate and the first metal layer), and via features (between the metal layers) to provide vertical routing. The multigate device 200 also includes other components, such as other conductive features (such as redistribution layer or RDL), passivation layer(s) to provide sealing effect, and/or bonding structures to provide an interface between the multigate device 200 and a circuit board (such as a printed circuit board) to be formed on the interconnect structure.

In some embodiments, the source/drain features may be formed by other suitable method. For example, the method includes first etching to recess the source/drain regions; a deposition process to deposit one or more sacrificial material layers on sidewalls of the dielectric fins; and epitaxially growth with one or more semiconductor material. The method further includes second etching to remove the deposited sacrificial material layer leaving airgaps between the epitaxial grown source/drain feature and the adjacent dielectric fin. The deposition is designed to form the sacrificial layer with desired shape, such that the final S/D feature has a bar or lollipop like shape. For example, the deposition may include one or more deposition process controlled to have respective deposition characteristics, such as one with conformal deposition (such as atomic layer deposition), another one with more directional deposition (such as bottom-up deposition, or plasma deposition with higher bias power), and another one with more lateral deposition. In some embodiments, the deposited layer is trimmed to achieve the desired shape by a suitable process, such as performing tilted plasma treatment to the upper portions of the deposited dielectric layer, and then another etching process to partially remove the lower portions of the deposited dielectric layer.

The present disclosure provides multigate device and method making the same for many different embodiments. An exemplary multigate device includes gate stacks with modified profiles, such as wrapping around each of channel layers 215' and further laterally extending at four corners of the corresponding channel layer. The gate extensions extend to partially wrapping around the inner spacers and provide additional gate control to the corresponding areas of the channel layer.

By implementing the disclosed device structure and the method making the same in various embodiments, some of advantages described below may present. However, it is understood that different embodiments disclosed herein offer different advantages and that no particular advantage is necessarily required in all embodiments. As one example, the gate extensions add additional gate control to the portions of the channel layers in corners, and therefore enhance the circuit performance of the GAA transistors, which includes increasing the on current Ion, decreasing the off current $I_{off}$, reducing the short channel effect, and reducing the subthreshold leakage.

In one example aspect, the present disclosure provides a semiconductor structure. The semiconductor structure includes a fin region formed on a substrate, wherein the fin region includes multiple channels vertically stacked on the substrate; a gate stack disposed on the fin region, wherein the gate stack is wrapping around each of the multiple channels and includes gate extensions being extending laterally to be overlapped with inner spacers; and a pair of source/drain (S/D) features formed on the fin region, interposed by the gate stack, and connected with the multiple channels.

In another example aspect, the present disclosure provides a method of semiconductor fabrication. The method includes forming a semiconductor stack on a substrate, wherein the semiconductor stack includes first semiconductor layers and second semiconductor layers being alternatively stacked, each of the second semiconductor layers including a gradient composition; patterning the semiconductor stack to form a fin region; forming a dummy stack disposed on the fin region; forming source/drain (S/D) features on the fin region and interposed by the dummy gate stack; removing the dummy gate stack, resulting in a gate trench in an interlayer dielectric (ILD) layer; performing a first etching process in the gate trench to selectively remove the first semiconductor layers; performing a second etching process to the second semiconductor layers in the gate trench, thereby laterally extending the gate trench and forming undercuts underlying gate spacers; and forming a gate stack and gate extensions in the gate trench, the gate stack wrapping around each of the second semiconductor layers, and the gate extensions inserted in the undercuts.

In yet another example aspect, the present disclosure provides a semiconductor structure. The semiconductor structure includes a fin region formed on a substrate, wherein the fin region includes multiple channels vertically stacked on the substrate; a gate stack disposed on the fin region, wrapping around each of the multiple channels; gate spacers disposed on sidewalls of the gate stack; source/drain (S/D) features formed on the fin region, interposed by the gate stack, and connected with the multiple channels; and inner spacers disposed on sidewalls of the S/D features and underlying the gate spacers, wherein the gate stack is laterally extending to partially wrap around the inner spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a fin region formed on a substrate, wherein the fin region includes multiple channels vertically stacked on the substrate;
   a gate stack disposed on the fin region, wherein the gate stack is wrapping around each of the multiple channels, and wherein the gate stack includes a gate dielectric layer and a gate electrode disposed on the gate dielectric layer;
   a pair of source/drain (S/D) features formed on the fin region, interposed by the gate stack, and connected with the multiple channels; and
   inner spacers disposed on sidewalls of the pair of S/D features, wherein the gate stack includes gate extensions that overlapped with the inner spacers.

2. The semiconductor structure of claim 1, wherein one of the gate extensions laterally extends on a top surface of one of the channels to be partially overlapped with the inner spacers.

3. The semiconductor structure of claim 2, wherein one of the gate extensions laterally extends on a bottom surface of the one of the channels to be partially overlapped with the inner spacers.

4. The semiconductor structure of claim 1, further comprising
   gate spacers disposed on sidewalls of the gate stack, each laterally spanning a first dimension L1; and
   the inner spacers directly underlying the gate spacers and disposed on sidewalls of the S/D features, wherein each of the gate extensions of the gate stack laterally spans a second dimension L2 being less than the first dimension L1.

5. The semiconductor structure of claim 4, wherein a ratio L2/L1 is less than 50%.

6. The semiconductor structure of claim 5, wherein the ratio L2/L1 ranges between 10% and 30%.

7. The semiconductor structure of claim 4, wherein
   each of the inner spacers vertically spans a third dimension L3; and
   the each of the gate extensions of the gate stack vertically spans a fourth dimension L4 being less than the third dimension L3.

8. The semiconductor structure of claim 7, wherein a ratio L4/L3 is less than 30%.

9. The semiconductor structure of claim 8, wherein the ratio L4/L3 ranges between 10% and 20%.

10. The semiconductor structure of claim 4, wherein the gate stack laterally extends below a bottommost inner spacer of the inner spacers and directly disposed on the substrate.

11. The semiconductor structure of claim 4, wherein
    each of the channels includes a first segment directly underlying the gate stack, and a second segment directly underlying the gate spacers and contacting one of the S/D features;
    the first segment vertically spans a first dimension D1; and
    the second segment vertically spans a second dimension D2 being greater than the first dimension D1.

12. The semiconductor structure of claim 11, wherein a ratio D1/D2 ranges between 30% and 40%.

13. A semiconductor structure, comprising:
    a fin region formed on a substrate, wherein the fin region includes multiple channels vertically stacked on the substrate;
    a gate stack disposed on the fin region, wrapping around each of the multiple channels, wherein the gate stack includes a gate dielectric layer and a gate electrode disposed on the gate dielectric layer;
    gate spacers disposed on sidewalls of the gate stack;
    source/drain (S/D) features formed on the fin region, interposed by the gate stack, and connected with the multiple channels; and
    inner spacers disposed on sidewalls of the S/D features and underlying the gate spacers, wherein the gate stack is laterally extending to partially wrap around the inner spacers.

14. The semiconductor structure of claim 13, wherein
    each of the gate spacers laterally spans a first dimension L1;
    each of expended portions of the gate stack laterally spans a second dimension L2 being less than the first dimension L1;
    each of the channels includes a first segment directly underlying the gate stack, and a second segment directly underlying the gate spacers and contacting one of the S/D features;
    the first segment vertically spans a first dimension D1; and
    the second segment vertically spans a second dimension D2 being greater than the first dimension D1.

15. The semiconductor structure of claim 13, wherein the gate stack laterally extends below a bottommost inner spacer of the inner spacers and directly disposed on the substrate.

16. A semiconductor structure, comprising:
    a fin region formed on a substrate, wherein the fin region includes multiple channels vertically stacked on the substrate;
    a gate stack disposed on the fin region, wherein the gate stack is wrapping around each of the multiple channels, and wherein the gate stack includes a gate dielectric layer and a gate electrode disposed on the gate dielectric layer;
    a pair of source/drain (S/D) features formed on the fin region, interposed by the gate stack, and contacting the each of the multiple channels; and
    inner spacers disposed on sidewalls of the pair of S/D features, wherein the gate stack includes gate extensions that are overlapped with the inner spacers, and wherein one of the gate extensions laterally extends on a top surface of one of the channels to be overlapped with the inner spacers.

17. The semiconductor structure of claim 16, wherein one of the gate extensions laterally extends on a bottom surface of the one of the channels to be partially overlapped with the inner spacers.

18. The semiconductor structure of claim 16, further comprising
    gate spacers disposed on sidewalls of the gate stack, each laterally spanning a first dimension L1;
    the inner spacers directly underlying the gate spacers and disposed on sidewalls of the S/D features, wherein each of the gate extensions of the gate stack laterally spans a second dimension L2 being less than the first dimension L1;
    each of the inner spacers vertically spans a third dimension L3; and
    the each of the gate extensions of the gate stack vertically spans a fourth dimension L4 being less than the third dimension L3.

19. The semiconductor structure of claim 18, wherein
each of the channels includes a first segment directly underlying the gate stack, and a second segment directly underlying the gate spacers and contacting one of the S/D features;
the first segment vertically spans a first dimension D1; and
the second segment vertically spans a second dimension D2 being greater than the first dimension D1.

20. The semiconductor structure of claim 16, wherein the gate stack laterally extends below a bottommost inner spacer of the inner spacers and directly disposed on the substrate.

* * * * *